US008432534B2

(12) United States Patent
Shibazaki

(10) Patent No.: US 8,432,534 B2
(45) Date of Patent: Apr. 30, 2013

(54) HOLDING APPARATUS, POSITION DETECTION APPARATUS AND EXPOSURE APPARATUS, MOVING METHOD, POSITION DETECTION METHOD, EXPOSURE METHOD, ADJUSTMENT METHOD OF DETECTION SYSTEM AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 589 days.

(21) Appl. No.: 12/437,079

(22) Filed: May 7, 2009

(65) Prior Publication Data

US 2009/0233234 A1 Sep. 17, 2009

Related U.S. Application Data

(63) Continuation of application No. PCT/JP2007/071702, filed on Nov. 8, 2007.

(30) Foreign Application Priority Data

Nov. 9, 2006 (JP) ................................. 2006-303669

(51) Int. Cl.
  *G03B 27/62* (2006.01)
  *G01B 11/00* (2006.01)
(52) U.S. Cl.
  USPC ............................................. 355/75; 356/401
(58) Field of Classification Search ............. 250/492.22, 250/548; 355/52, 53, 72–75; 356/399–401
  See application file for complete search history.

(56) References Cited

U.S. PATENT DOCUMENTS

| 4,465,368 | A | | 8/1984 | Matsuura et al. |
| 5,150,391 | A | * | 9/1992 | Ebinuma et al. ................ 378/34 |
| 5,243,195 | A | | 9/1993 | Nishi |
| 5,448,332 | A | | 9/1995 | Sakakibara et al. |
| 5,969,441 | A | | 10/1999 | Loopstra et al. |
| 6,166,812 | A | * | 12/2000 | Ueda ............................. 356/401 |

(Continued)

FOREIGN PATENT DOCUMENTS

| EP | 1 420 298 A2 | 5/2004 |
| EP | 1 630 585 A1 | 3/2006 |

(Continued)

OTHER PUBLICATIONS

International Search Report issued in Application No. PCT/JP2007/071702; mailed on Feb. 19, 2008.

(Continued)

*Primary Examiner* — Stewart Fraser
(74) *Attorney, Agent, or Firm* — Oliff & Berridge, PLC

(57) ABSTRACT

By a force generation device which can generate a magnetic attraction and gas static pressure between a detection system provided on a lower surface side of an FIA surface plate and a surface plate, a predetermined clearance is formed between the detection system and the surface plate, and in a state where the clearance is formed (a floating state), the detection system is driven by a drive device in at least an uniaxial direction within a horizontal plane. Therefore, because the detection system is in a non-contact state to the base platform, movement (positioning) of the detection system with high precision becomes possible. Further, by setting an attraction larger than a repulsion generated by the force generation device, the detection system can be fixed (landed) in a state positioned with high precision.

73 Claims, 13 Drawing Sheets

U.S. PATENT DOCUMENTS

| | | |
|---|---|---|
| 6,208,407 B1 | 3/2001 | Loopstra |
| 6,590,634 B1 | 7/2003 | Nishi et al. |
| 6,611,316 B2 | 8/2003 | Sewell |
| 6,778,257 B2 | 8/2004 | Bleeker et al. |
| 6,788,385 B2* | 9/2004 | Tanaka et al. .................. 355/53 |
| 7,023,610 B2 | 4/2006 | Ohtsuki et al. |
| 7,230,682 B2 | 6/2007 | Shimizu et al. |
| 2001/0028456 A1* | 10/2001 | Nishi ............................ 356/400 |
| 2002/0041377 A1 | 4/2002 | Hagiwara et al. |
| 2002/0061469 A1 | 5/2002 | Tanaka |
| 2003/0025890 A1 | 2/2003 | Nishinaga |
| 2006/0098184 A1* | 5/2006 | Shibazaki ...................... 355/75 |
| 2006/0187431 A1* | 8/2006 | Shibazaki ...................... 355/53 |
| 2006/0227309 A1 | 10/2006 | Loopstra et al. |
| 2008/0074635 A1* | 3/2008 | Kimura .......................... 355/75 |

FOREIGN PATENT DOCUMENTS

| | | |
|---|---|---|
| JP | A-60-147741 | 8/1985 |
| JP | A-61-44429 | 3/1986 |
| JP | A-3-253018 | 11/1991 |
| JP | A-9-246150 | 9/1997 |
| JP | A-10-163099 | 6/1998 |
| JP | A-10-214783 | 8/1998 |
| JP | A-10-223528 | 8/1998 |
| JP | A-2000-68192 | 3/2000 |
| JP | A-2000-505958 | 5/2000 |
| JP | A-2003-241396 | 8/2003 |
| JP | A-2004-519850 | 7/2004 |
| JP | A-2007-184342 | 7/2007 |
| WO | WO 99/28790 A1 | 6/1999 |
| WO | WO 99/46835 A1 | 9/1999 |
| WO | WO 99/49504 A1 | 9/1999 |
| WO | WO 01/35168 A1 | 5/2001 |
| WO | WO 03/065428 A1 | 8/2003 |
| WO | WO 2004/053955 A1 | 6/2004 |
| WO | WO 2004/107011 A1 | 12/2004 |
| WO | WO 2006/038952 A2 | 4/2006 |

OTHER PUBLICATIONS

Feb. 19, 2008 Written Opinion of the International Search Authority issued in PCT/JP2007/071702 (with translation).

English translation of WO 2004/053955 A1, Published Jun. 2004.

English translation of WO 99/49504, Published Sep. 1999.

Aug. 3, 2012 Office Action issued in Japanese Patent Application No. 2008-543118 (with translation).

* cited by examiner

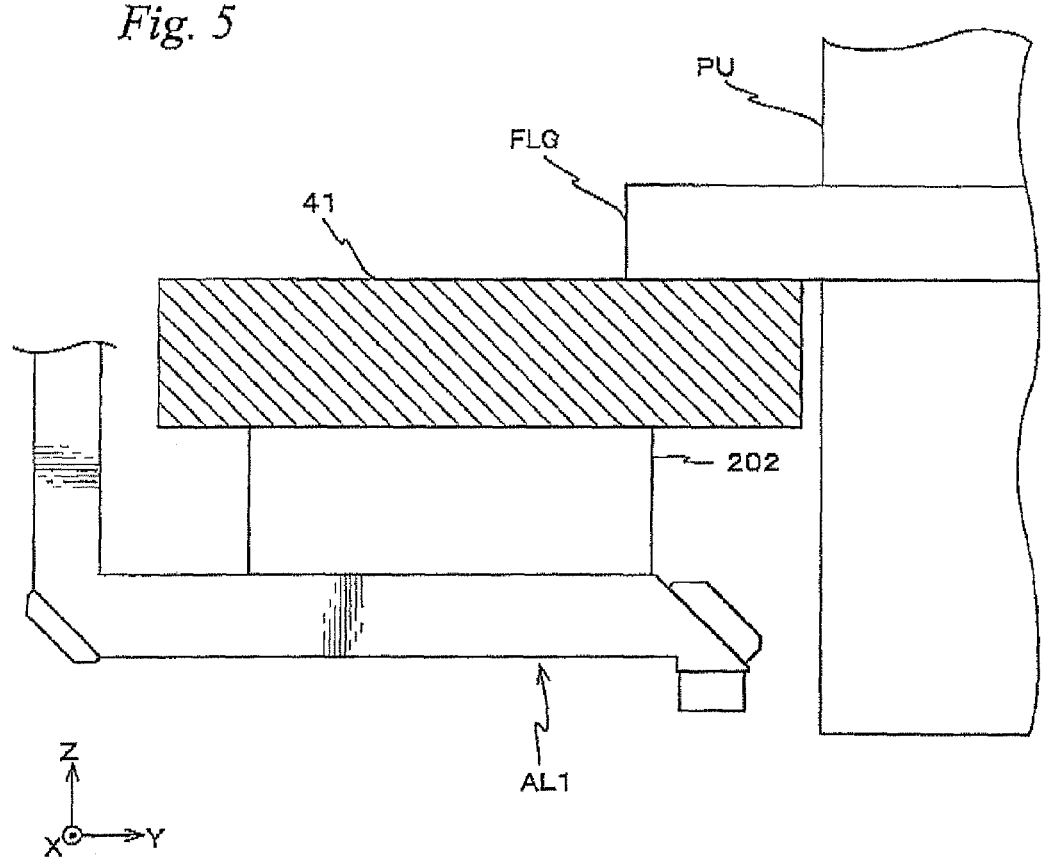

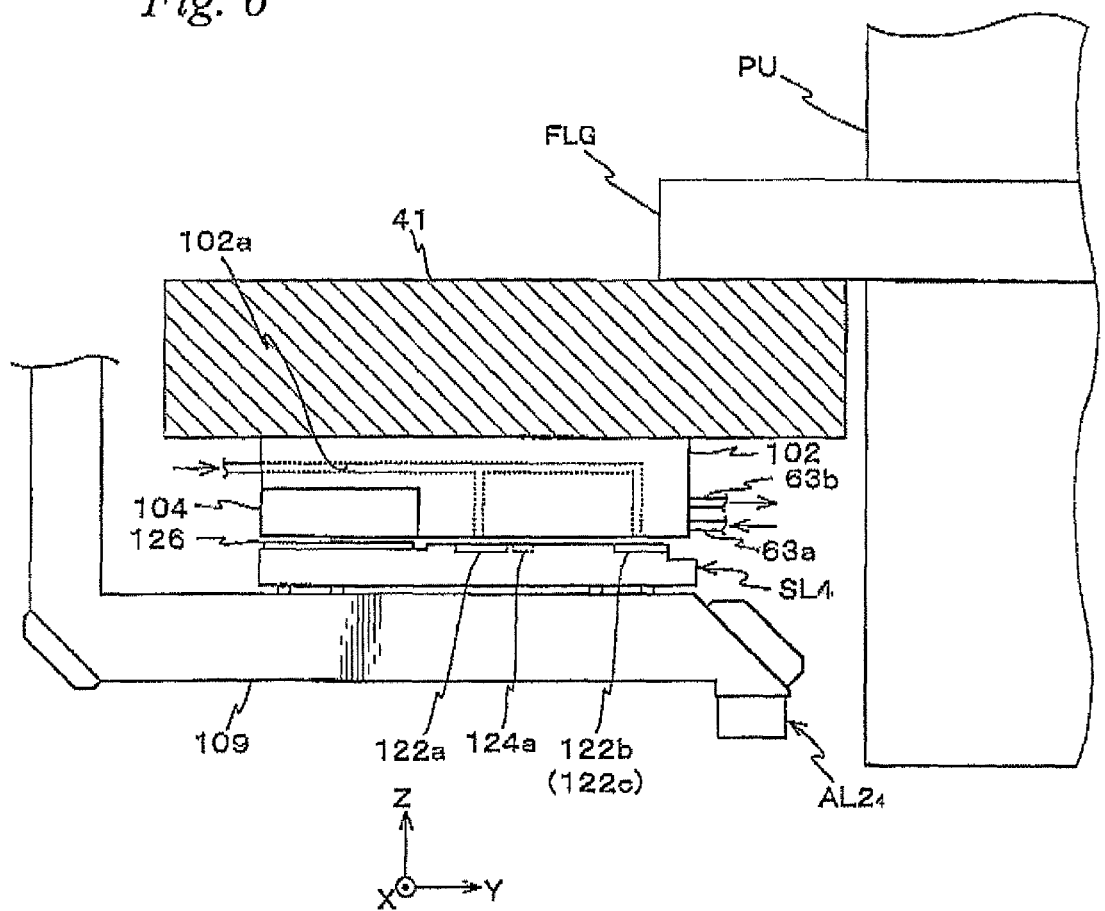

HOLDING APPARATUS, POSITION DETECTION APPARATUS AND EXPOSURE APPARATUS, MOVING METHOD, POSITION DETECTION METHOD, EXPOSURE METHOD, ADJUSTMENT METHOD OF DETECTION SYSTEM AND DEVICE MANUFACTURING METHOD

CROSS-REFERENCE TO RELATED APPLICATIONS

This is a continuation of International Application PCT/JP2007/071702, with an international filing date of Nov. 8, 2007, the disclosure of which is hereby incorporated herein by reference in its entirety, which was not published in English.

BACKGROUND OF THE INVENTION

1. Field of the Invention

The present invention relates to holding apparatus, position detection apparatus and exposure apparatus, moving methods, position detection methods, exposure methods, adjustment methods of detection systems, and device manufacturing methods, and more particularly to a holding apparatus which movably holds a detection system detecting a mark on an object, a position detection apparatus equipped with a detection system which detects a mark on an object and an exposure apparatus equipped with the position detection apparatus, a moving method to move a detection system which detects a mark on an object, a position detection method using the moving method, an exposure method in which a pattern is formed on an object by an irradiation of an energy beam, an adjustment method of a detection system which detects a mark on an object, and a device manufacturing method which uses the exposure apparatus or the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

Meanwhile, in a lithography process for manufacturing semiconductor devices or the like, multilayer circuit patterns are overlaid and formed on a wafer, and when the overlay accuracy between the layers is poor, the semiconductor devices or the like cannot achieve predetermined circuit characteristics, which results in detectives in some cases. Therefore, normally, a mark (alignment mark) is arranged in advance in each of a plurality of shot areas on a wafer and the position information (coordinate value) of the mark on a stage coordinate system of an exposure apparatus is detected. After that, based on position information of the mark and known position information of a pattern (e.g. a reticle pattern) that is newly formed, water alignment is performed in which the position of one shot area on the wafer is aligned with the pattern.

As a method of the wafer alignment, global alignment in which the position of each shot area is aligned, for example, by detecting alignment marks of only several shot areas (which are also called sample shot areas or alignment shot areas) on a wafer to obtain regularity of the array of the shot areas has been mainly used, in consideration of throughput. In particular, recently, the Enhanced Global Alignment (EGA) in which the array of shot areas on a wafer is precisely computed by a statistical method has been a mainstream (e.g. refer to U.S. Pat. No. 5,243,195).

However, the requirement for overlay accuracy is gradually getting stricter to cope with finer integrated circuits, and also in the EGA, in order to increase the computation accuracy, it is becoming essential to increase the number of sample shot areas, that is, to increase the number of marks to be detected.

However, since the increase in the number of sample shot areas in the EGA described above causes the decrease in throughput of the exposure apparatus, it is practically difficult to employ the measures of merely increasing the number of sample shots. Because of this, proposals are recently being made on alignment technology which uses a plurality of alignment systems (mark detection systems).

SUMMARY OF THE INVENTION

The present invention was made under the circumstances described above, and according to a first aspect of the present invention, there is provided a holding apparatus that movably holds a detection system which detects a mark on an object, the apparatus comprising: a support device which supports the detection system; and a drive device which drives the detection system supported via a predetermined clearance by the support device at least in a uniaxial direction in a horizontal plane.

According to this apparatus, the detection system supported by the support device via a predetermined clearance is driven at least in a uniaxial direction in the horizontal plane by the drive device. Accordingly, because the detection system is driven in a non-contact manner with respect to the support device, a highly precise movement (including positioning) which is not affected by frictional force and the like becomes possible.

According to a second aspect of the present invention, there is provided a first position detection apparatus, the apparatus comprising: a detection system which detects a mark on an object; and a holding apparatus of the present invention which movably holds the detection system.

According to this apparatus, because the detection system is being held by the holding apparatus of the present invention, the detection system can be positioned with high precision. Accordingly, by using this detection system, it becomes possible to detect positional information of the mark on the object with good precision.

According to a third aspect of the present invention there is provided a second position detection apparatus which detects positional information of a mark on an object, the apparatus comprising, a detection system which detects a mark on the object; a force generation device which can generate an attraction and a repulsion between the detection system and a fixed portion and can also adjust a magnitude of at least one of the attraction and the repulsion; and a drive device which drives the detection system at least uniaxially in the horizontal plane, in a state where a predetermined clearance is formed between the detection system and the fixed portion by the attraction and the repulsion generated by the force generation device.

According to this apparatus, because the detection system is driven in a non-contact state with respect to the fixed portion, a highly precise movement (positioning) of the detection system becomes possible. By detecting positional information of the mark on the object using the detection system which has been positioned with high precision in the manner described above, detection of the positional information of the mark can be performed with high precision.

According to a fourth aspect of the present invention, there is provided an exposure apparatus that forms a pattern on a sensitive object by an irradiation of an energy beam, the apparatus comprising: one of the first and second position detection apparatus of the present invention which detects positional information of a mark on the sensitive object; and a patterning device which irradiates the energy beam on the sensitive object using detection results by the position detection apparatus.

According to this apparatus, by one of the first and second position detection apparatus of the present invention, positional information of the mark on the sensitive object is detected with high precision, and a pattern is formed by irradiating an energy beam on the sensitive object with a patterning device, using the detection results. Accordingly, it becomes possible to perform a highly precise pattern formation to the sensitive object.

According to a fifth aspect of the present invention, there is provided a first moving method to move a detection system which detects a mark on an object in a horizontal plane, wherein by an attraction and a repulsion generated between the detection system and a fixed portion, a predetermined clearance is formed between the detection system and the fixed portion, whereby the detection system is moved in a horizontal plane, while the clearance is maintained.

According to this method, the detection system is moved in the horizontal plane while maintaining the predetermined clearance formed between the detection system and the fixed portion. Accordingly, a highly precise movement (including positioning) of the detection system which is not affected by frictional force and the like becomes possible.

According to a sixth aspect of the present invention, there is provided a second moving method to move a detection system which detects a mark on an object in a horizontal plane, the method comprising: a switch-off process in which power supply of a measurement system used to measure a position of the detection system in the horizontal plane is switched off in a state where the detection system is positioned at a predetermined position within the horizontal plane; a storing process in which a measurement value of the measurement system just before switching off the power supply is stored; and a setting process in which on moving the detection system from a state positioned at the predetermined position, power supply of the measurement system is switched on prior to the moving, and the measurement value is set as an initial value of the measurement system.

According to this method, the influence to the detection accuracy of the detection system by the heat generation of the power supply of the measurement system in a state where the detection system is positioned at a predetermined position can be lowered as much as possible. Further, while the power supply is switched on again when the detection system is moved from the state positioned at the predetermined position, initial setting such as a reset operation of the measurement system and the like does not have to be performed at this point.

According to a seventh aspect of the present invention, there is provided a third moving method to move a detection system which detects a mark on an object in a horizontal plane, the method comprising: a measurement process in which positional information of a mark member and a detection system in the horizontal plane is measured moving the mark member and the detection system in a uniaxial direction within the horizontal plane so that a mark of the mark member is maintained within a detection area of the detection system; and a movement process in which the detection system is moved in the uniaxial direction, using the positional information which has been measured.

According to this method, positional information of a mark of the mark member and the detection system in the horizontal plane is measured, while moving the mark member and the detection system uniaxially in the horizontal plane so that the mark of the mark member is maintained within the detection area of the detection system, and the detection system is moved uniaxially using the positional information which has been measured. Accordingly, the detection system can be moved, with a movement coordinate of the object serving as a standard.

According to an eighth aspect of the present invention, there is provided a position detection method in which positional information of a mark on an object is detected, the method comprising: moving the detection system using one of the first and third moving methods of the present invention; and detecting a mark on the object by the detection system which has been moved.

According to this method, the detection system can be moved (including positioning) with high precision, and by using the detection system which has been moved, it becomes possible to detect positional information the mark on the object with good precision.

According to a ninth aspect of the present invention, there is provided a first exposure method in which a pattern is formed on a sensitive object by an irradiation of an energy beam, the method comprising: a detection process in which positional information of a mark on the sensitive object is detected by moving the detection system by one of the first and third moving methods of the present invention; and a pattern formation process in which the energy beam is irradiated on the sensitive object using the detection results, and a pattern is formed on the sensitive object.

According to this method, it becomes possible to form a pattern on a sensitive object with good precision.

According to a tenth aspect of the present invention, there is provided a second exposure method in which a pattern is formed on an object by an irradiation of an energy beam, the method comprising: a detection process in which positional information of a mark of the sensitive object is detected, using a detection system which is movably held by the holding apparatus of the present invention; and a pattern formation process in which the energy beam is irradiated on the sensitive object using the detection results, and a pattern is formed on the sensitive object.

According to this method, it becomes possible to form a pattern on a sensitive object with good precision.

According to an eleventh aspect of the present invention, there is provided an adjustment method of a detection system which detects a mark on an object and is movable at least in a horizontal plane, the method comprising: a first process in which the detection system is moved to a predetermined movement limit position in a uniaxial direction within the horizontal plane by a drive device which drives the detection system by electromagnetic interaction in the horizontal plane; a second process in which magnetic pole alignment of the drive device is performed at the movement limit position; a third process in which the detection system is moved by the drive device approximately to the center of a movement range of the detection system in the unilateral direction; a fourth process in which the drive device moves the detection system to a predetermined movement limit position related to one side of the other axis direction which intersects the uniaxial direction; and a fifth process in which an origin search of a measurement device measuring the positional information of the detection system in the uniaxial direction is performed, while moving the detection system from the movement limit position on one side of the other axis direction to the other side of the other axis direction.

According to this method, because the magnetic pole alignment of the drive device is performed before the origin search of the measurement device is performed, the detection system is in an adjusted state so that being driven with high precision within the horizontal plane is possible in the case of the origin search. Further, because the origin is searched while moving the detection system from a state where the system is moved to a movement limit position on one side of the other axis direction to the other side of the other axis direction, an origin search which uses the movement limit position as a reference can be performed. Accordingly, an origin search of a highly precise measurement device can be performed.

Further, in a lithography process, by forming a pattern on a sensitive object using the exposure apparatus of the present invention, productivity of highly integrated microdevices can be improved. Further, in a lithography process, by forming a pattern on a sensitive object using one of the first and second exposure methods of the present invention, productivity of highly integrated microdevices can be improved. Accordingly, furthermore from another point of view, it can also be said that the present invention is a device manufacturing method which uses the exposure apparatus of the present invention, or one of the first and second exposure methods of the present invention.

BRIEF DESCRIPTION OF THE DRAWINGS

In the accompanying drawings;

FIG. 5 is a view that shows alignment system AL1 when viewed from the +X direction;

FIG. 6 is a view that shows alignment system $AL2_4$ when viewed from the +X direction;

FIG. 73 is a perspective view which shows alignment system $AL2_3$ extracted from FIG. 4;

FIG. 8 is a perspective view that shows an enlarged view of static gas bearing 122a;

DESCRIPTION OF THE EMBODIMENTS

An embodiment of the present invention will be described below, with reference to FIGS. 1 to 14C.

Figure 1:
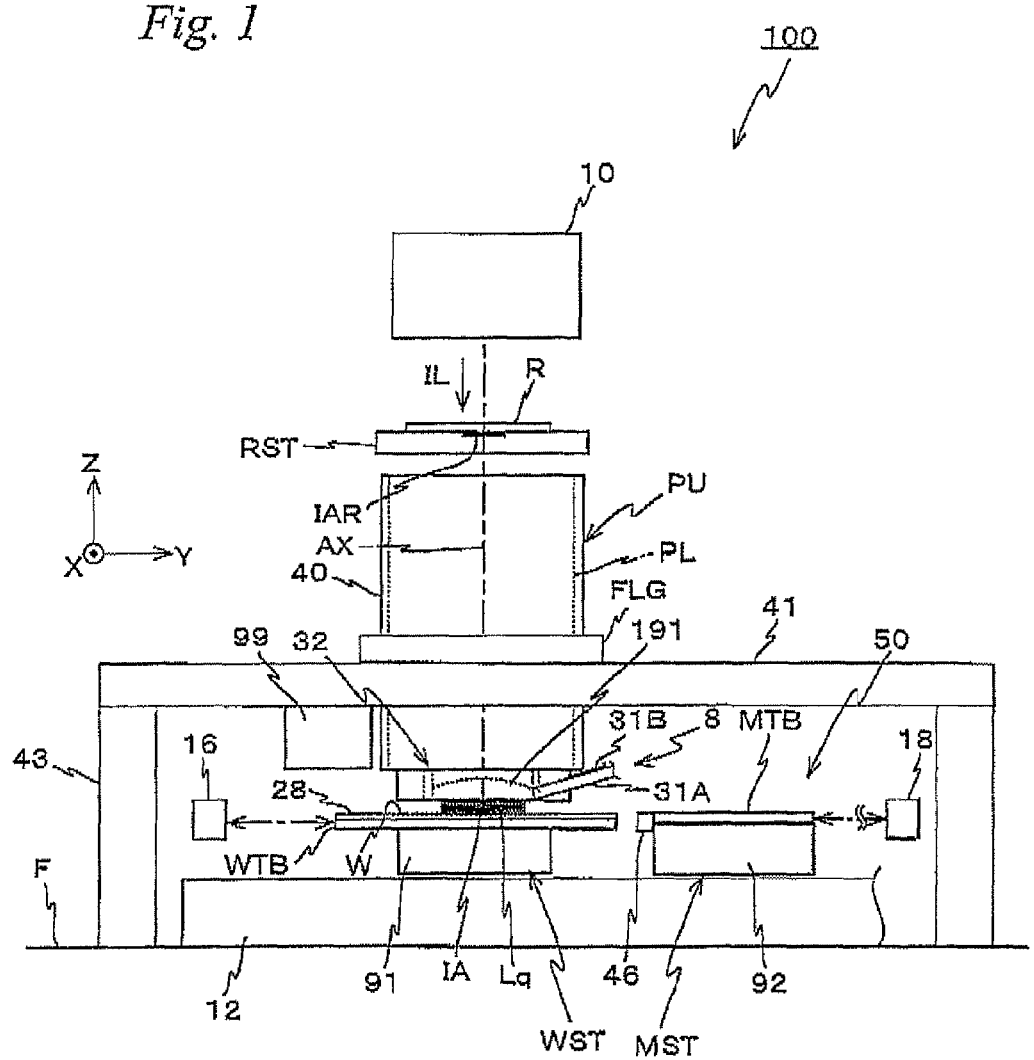
FIG. 1 is a view schematically showing the configuration of an exposure apparatus related to an embodiment.

FIG. 1 shows a schematic configuration of an exposure apparatus 100 related to the embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as $\theta x$, $\theta y$, and $\theta z$ directions, respectively.

Exposure apparatus 100 includes an illumination system 10, a reticle stage RST that holds a reticle R that is illuminated by an illumination light for exposure (hereinafter, referred to as "illumination light" or "exposure light") IL from illumination system 10, a projection unit PU that includes projection optical system PL that projects illumination light IL emitted from reticle R on a wafer W, a stage unit 50 that has a wafer stage WST and a measurement stage MST, their control system, and the like. On wafer stage WST, wafer W is mounted.

Illumination system 10 includes a light source, an illuminance uniformity optical system, which includes an optical integrator and the like, and an illumination optical system that has a reticle blind and the like (none of which are shown), as is disclosed in, for example, U.S. Patent Application Publication No. 2003/0025890 and the like. In illumination system 10, a slit-shaped illumination area IAR which is set on reticle R with a reticle blind is illuminated by illumination light (exposure light) IL with a substantially uniform illuminance. In this case, as illumination light IL, for example, an ArF excimer laser beam (wavelength 193 nm) is used. Further, as the optical integrator, a fly-eye lens, a rod integrator (an internal reflection type integrator), or a diffractive optical element and the like can be used.

On reticle stage RST, reticle R on which a circuit pattern or the like is formed on its pattern surface (the lower surface in FIG. 1) is fixed, for example, by vacuum chucking. Reticle stage RST is finely drivable within an XY plane by a reticle stage drive section (not shown), and reticle stage RST is also drivable in a predetermined scanning direction (the Y-axis direction, which is the lateral direction of the page surface in FIG. 1) at a designated scanning speed. Although it is not illustrated, the positional information of reticle stage RST is constantly measured by a reticle stage interferometer system.

Projection unit PU includes a barrel 40, and projection optical system PL that has a plurality of optical elements which are held in a predetermined positional relation inside barrel 40. Projection unit PU is held by a mainframe 41 via a flange FLG arranged on the circumferential portion of barrel

40. Mainframe 41 is supported horizontally on floor surface F by a plurality of (e.g. three) support members 43 via vibration isolation units (not shown).

As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, a reduced image of the circuit pattern (a reduced image of a part of the circuit pattern) of reticle R is formed within illumination area IAR via projection optical system PL (projection unit PU), with illumination light IL that has passed through reticle R which is placed so that its pattern surface substantially coincides with a first plane (an object plane) of projection optical system PL, in an area (hereinafter also referred to as "exposure area") IA conjugate to illumination area IAR on wafer W whose surface is coated with a resist (a photosensitive agent) and is placed on a second plane (an image plane) side of projection optical system PL. Incidentally, in the embodiment, while projection unit PU was mounted on mainframe 41, as disclosed in, for example, the pamphlet of International Publication No. 2006/038952, the plurality of support members 43 can be extended to the +Z side in FIG. 1 and projection unit PU can be supported in a suspended state at three points with respect to mainframe 41.

Incidentally, in exposure apparatus 100 of the embodiment, because exposure is performed applying a liquid immersion method, an opening on the reticle side becomes larger with the substantial increase of the numerical aperture NA. Therefore, in a dioptric system consisting only of lenses, it becomes difficult to satisfy the Petzval condition, which tends to lead to an increase in the size of the projection optical system. In order to avoid such an increase in size of the projection optical system, a reflection/refraction system (a catadioptric system) which is configured including a mirror and a lens can be employed. As this reflection/refraction system, an in-line type catadioptric system having a single optical axis whose details are disclosed in, for example, the pamphlet of International Publication No. 2004/107011 can be used.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. Nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Local liquid immersion device 8 fills liquid Lq in the space between tip lens 191 and wafer W by nozzle unit 32, so that a local liquid immersion space (equivalent to a liquid immersion area 14) which includes the optical path space of illumination light IL is formed. Accordingly, nozzle unit 32 is also called a liquid immersion space formation member or a containment member (or, a confinement member).

In the embodiment, by the liquid being supplied in the space between tip lens 191 and wafer W from a liquid supply device (not shown) via liquid supply pipe 31A, the supply flow channel, and the supply opening, and the liquid being recovered from the space between tip lens 191 and wafer W by a liquid recovery device (not shown) via the recovery opening, the recovery flow channel, and liquid recovery pipe 31B, a constant quantity of liquid Lq (refer to FIG. 1) is held in the space between tip lens 191 and wafer W. In this case, liquid Lq held in the space between tip lens 191 and wafer W is constantly replaced.

Incidentally, in the embodiment, as the liquid, pure water (hereinafter, to be simply referred to as "water") that transmits the ArF excimer laser beam (light with a wavelength of 193 nm) is to be used. Refractive index n of the water with respect to the ArF excimer laser beam is around 1.44, and in the water the wavelength of illumination light IL is 193 nm×l/n, shorted to around 134 nm. Incidentally, in FIG. 2, the liquid immersion area formed by water Lq is shown by a reference code 14.

Further, also in the case measurement stage MST is located below projection unit PU, the space between measurement table MST (to be described later) and tip lens 191 can be filled with water in a similar manner to the manner described above.

Stage device 50 is equipped with wafer stage WST and measurement stage MST placed on base board 12, an interferometer system including Y-axis interferometers 16 and 18 used to measure positional information of these stages WST and MST, an encoder system (stage encoder) (to be described later) and the like used to measure positional information of wafer stage WST at times such as on exposure and the like, as shown in FIG. 1.

On the bottom surface of each of wafer stage WST and measurement stage MST, for example, a vacuum preload type hydrostatic air bearing (hereinafter, referred to as an "air pad") is arranged at a plurality of points, and by these air pads, wafer stage WST and measurement stage MST are supported in a non-contact manner via a clearance of around several μm above base board 12.

Wafer stage WST, for example, includes a stage main section 91 which is movable by a plurality of linear motors within the XY plane, or more specifically, in the X-axis direction, the Y-axis direction, and the θz direction, and a wafer table WTB, which is mounted on stage main section 91 via a Z-leveling mechanism (not shown) (such as a voice coil motor) and is finely driven relative to stage main section 91 in the Z direction, the θx direction, and the θy direction.

Figure 2:
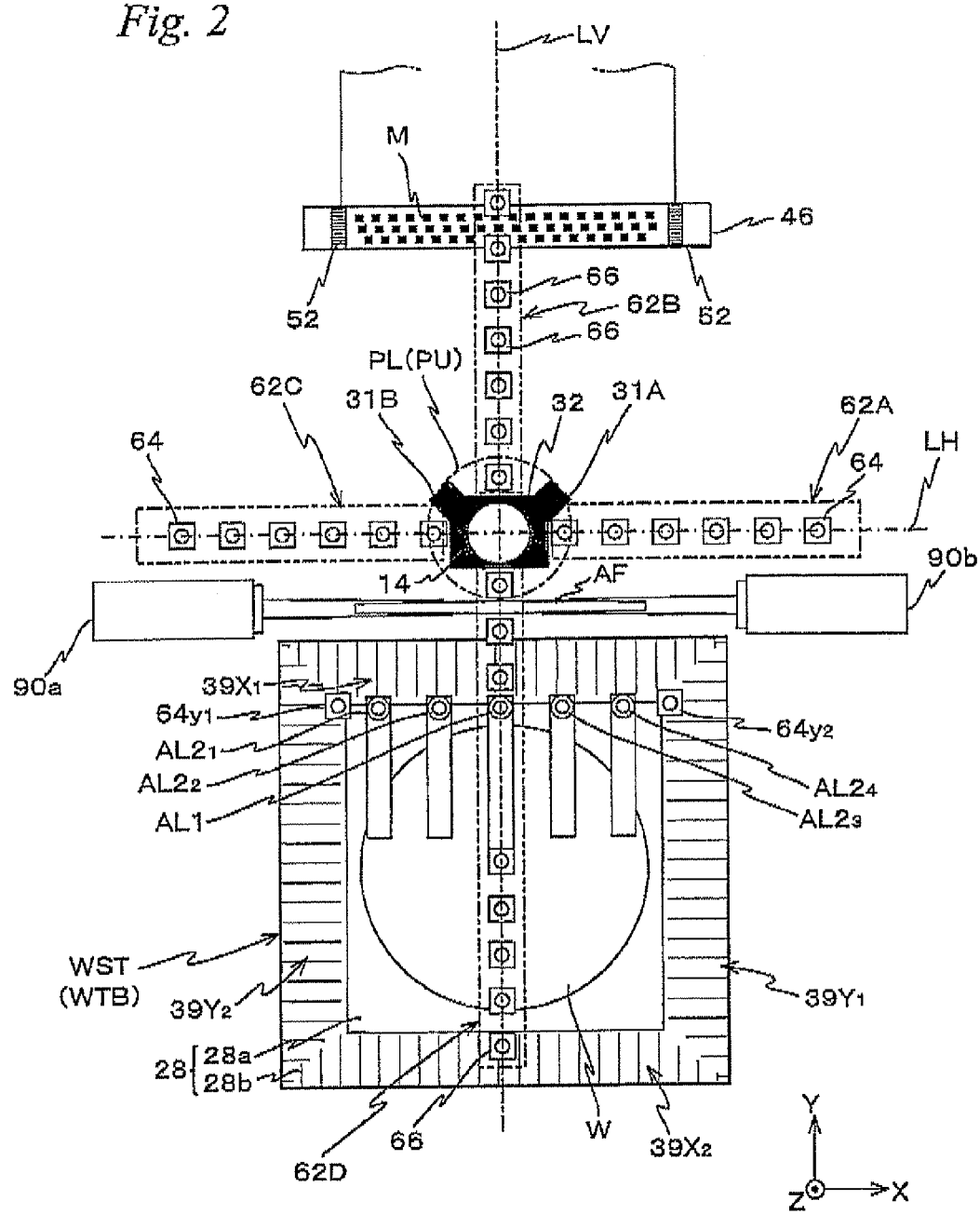
FIG. 2 is planar view showing a placement of a wafer stage, a measurement stage, and various measurement devices (an encoder, an alignment system, a multipoint AF system, a Z sensor and the like) equipped in the exposure apparatus in FIG. 1.

On wafer table WTB, a wafer holder (not shown) that holds wafer W by vacuum suction or the like is arranged. The wafer holder may also be formed integrally with wafer table WTB, but in the embodiment, the water holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has a surface (liquid repellent surface) on a substantially flush surface with the surface of the wafer mounted on the wafer holder to which liquid repellent processing with respect to liquid Lq is performed, has a rectangular outer shape (contour), and also has a circular opening slightly larger than the wafer holder (a mounting area of the wafer) which is formed in the center portion. Plate 28 is made of materials with a low coefficient of thermal expansion, such as glass or ceramics (e.g. such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Furthermore, as shown in FIG. 2, plate 28 has a first liquid repellent area 28a whose outer shape (contour) is rectangular enclosing a circular opening, and a second liquid repellent area 28b that has a rectangular frame (annular) shape placed around the first liquid repellent area 28a. On first liquid repellent area 28a, for example, at the time of an exposure operation, at least part of a liquid immersion area 14 that is protruded from the surface of the wafer is formed, and on second liquid repellent area 28b, scales for an encoder system (to be described later) are formed. Incidentally, at least part of the surface of plate 28 does not have to be the same surface as the surface of the wafer, that is, may have a different height from that of the surface of the wafer. Further, plate 28 may be a single plate, but in the embodiment, plate 28 is configured by combining a plurality of plates, for example, first and second liquid repellent plates that correspond to the first liquid repellent area 28a and the second liquid repellent area 28b respectively. In the embodiment, pure water is used as liquid Lq as is described above, and therefore, hereinafter the first liquid repellent area 28a and the second liquid repellent area 28b are also referred to as a first water repellent plate 28a and a second water repellent plate 28b.

On the upper surface of the second water repellent plate 28b, multiple grid lines axe directly formed in a predetermine pitch along each of the four sides. More specifically, in areas on one side and the other side in the X-axis direction of second water repellent plate 28b (both sides in the horizontal direction in FIG. 2), Y scales $39Y_1$ and $39Y_2$ are formed respectively, and Y scales $39Y_1$ and $39Y_2$ are each composed of a reflective grating (for example, a diffraction grating) having a periodic direction in the Y-axis direction in which grid lines having a longitudinal direction in the X-axis direction are formed in a predetermined pitch along the Y-axis direction. Similarly, in areas on one side and the other side in the Y-axis direction of second water repellent plate 28b (both sides in the vertical direction in FIG. 2), X scales $39X_1$ and $39X_2$ are formed respectively, and X scales $39X_1$ and $39X_2$ are each composed of a reflective grating (e.g. a diffraction grating) having a periodic direction in the X-axis direction in which grid lines having a longitudinal direction in the Y-axis direction are formed in a predetermined pitch along the X-axis direction. Incidentally, the pitch of the grating is shown much wider in FIG. 2 than the actual pitch, for the sake of convenience. Further, these scales are covered with the liquid repellent film (water repellent film) described above.

Referring back to FIG. 1, mirror-polishing is applied to the −Y end surface and the −X end surface of wafer table WTB, respectively, and reflection surfaces are formed. A wafer stage interferometer system (FIG. 1 shows only Y-axis interferometer 16, which is a part of the system) projects interferometer beams (measurement beams) on these reflection surfaces, and measures positional information (for example, including positional information in the X-axis, the Y-axis, and the Z-axis directions, and rotation information in the θx, the θy, and the θz directions) of wafer stage WST, and the measurement values are supplied to a controller (not shown). Incidentally, details of the interferometer system are disclosed in, for example, the pamphlet of International Publication No. 99/28790, Further, position control of wafer stage WST (wafer W) within the XY plane can be performed using only this interferometer system, or using both of the interferometer system and the encoder system to be described later, however, in the embodiment, position control of wafer stage WST is to be performed using only the encoder system at least during the exposure operation, and the interferometer system is to be used in a predetermined operation except for the exposure operation, such as, for example, in a calibration operation of the encoder system or the like. This calibration operation is performed to correct a long-term variation and the like of the measurement values of the encoder system, caused by, for example, temporal deformation of the scale and the like.

Measurement stage MST includes, for example, a stage main section 92, which moves within the XY plane by a linear motor or the like, and a measurement table MTB mounted on stage main section 92 via a Z-leveling mechanism (not shown).

Various types of measurement members are arranged at measurement table MTB (and stage main section 92). As such measurement members, for example, members such as an uneven illuminance measuring sensor that has a pinhole-shaped light-receiving section which receives illumination light IL on an image plane of projection optical system PL, an aerial image measuring instrument that measures an aerial image (projected image) of a pattern projected by projection optical system PL, a wavefront aberration measuring instrument by the Shack-Hartman method that is disclosed in, for example, the pamphlet of International Publication No. 03/065428 (the corresponding U.S. Pat. No. 7,230,682) and the like are employed. As the uneven illuminance measuring sensor, a sensor having a configuration similar to the one that is disclosed in, for example, U.S. Pat. No. 4,465,368 and the like can be used. Further, as the aerial image measuring instrument, an instrument having a configuration similar to the one that is disclosed in, for example, U.S. Patent Application Publication No. 2002/0041377 and the like can be used. In addition to each of the sensors described above, an illuminance monitor that has a light-receiving section having a predetermined area size that receives illumination light IL on the image plane of projection optical system PL may also be employed, which is disclosed in, for example, U.S. Patent Application Publication No. 2002/0061469 and the like.

On the −Y side end surface of measurement table MTB, a confidential bar (hereinafter shortly referred to as an "CD bar") 46, which is made up of a bar-shaped member having a rectangular sectional shape and serves as a reference member, is arranged extending in the X-axis direction. Incidentally, CD bar 46 is also referred to as a fiducial bar.

Since CD bar 46 serves as a prototype standard (measurement standard), optical glass ceramics with a low coefficient of thermal expansion, such as Zerodur (the brand name) of Schott AG are employed as its material. Further, the flatness degree of the upper surface (the surface) of CD bar 46 is set high to be around the same level as a so-called reference plane plate, and also as shown in FIG. 2, in the vicinity of one end and the other end in the longitudinal direction of CD bar 46, reference gratings (e.g. diffraction gratings) 52 whose periodic direction is in the Y-axis direction are formed, respectively.

Further, on the upper surface of CD bar 46, a plurality of reference marks M is formed in the placement as shown in FIG. 2. The plurality of reference marks M are formed in three-row arrays in the Y-axis direction in the same pitch, and the array of each row is formed being shifted from each other by a predetermined distance in the X-axis direction. As each of the reference marks M, a two-dimensional mark having a size that can be detected by a primary alignment system and secondary alignment systems (to be described later) is used Incidentally, in the embodiment, the surface of CD bar 46 and the surface of measurement table MTB (which may include the measurement members described above) are also covered with a liquid repellent film (water repellent film) severally.

Similarly, reflection surfaces are formed on the +Y end surface and the −X end surface of measurement table MTB. A measurement stage interferometer system (FIG. 1 shows only Y-axis interferometer 18, which is a part of the system) projects interferometer beams (measurement beams) on these reflection surfaces, and measures positional information (for example, including positional information in at least the X-axis and the Y-axis directions, and rotation information in the θz direction) of wafer stage WST, and the measurement values are supplied to the controller (not shown).

In exposure apparatus 100 of the embodiment, as shown in FIG. 2, a primary alignment system AL1 is arranged on a straight line (hereinafter, referred to as a reference axis) LV, which passes through the center of projection unit PU (optical axis AX of projection optical system PL, which also coincides with the center of exposure area IA previously described in the embodiment) and is also parallel to the Y-axis, the system having a detection center at a position that is spaced apart from optical axis AX at a predetermined distance on the −Y side. On one side and the other side in the X-axis direction with primary alignment system AL1 in between, secondary alignment systems AL2$_1$ and AL2$_2$, and AL2$_3$ and AL2$_4$ whose detection centers are substantially symmetrically placed with respect to reference axis LV are severally arranged. That is, five alignment systems AL1 and AL2$_1$ to AL2$_4$ are placed so that their detection centers are placed along the X-axis direction. Incidentally, in FIG. 1, the five alignment systems AL1 and AL2$_1$ to AL2$_4$ are shown as an aligner 99, including the holding apparatus (sliders) which hold these systems. In the embodiment, although aligner 99 is arranged at a mainframe 41, in the case the exposure apparatus in FIG. 1 employs a configuration where projection unit PU is supported in a suspended state with respect to mainframe 41 as is previously described, for example, aligner 99 can be supported in a suspended state integrally with projection unit PU, or aligner 99 can be arranged independently from projection unit PU at the measurement frame, supported in a suspended state from mainframe 41.

Incidentally, a concrete configuration and the like of aligner 99 will be described furthermore later on.

Furthermore, in exposure apparatus 100 of the embodiment, as shown in FIG. 2, four head units 62A to 62D of the encoder system are placed in four directions of nozzle unit 32 previously described. In actual, these head units 62A to 62D are fixed to the foregoing mainframe 41 that holds projection unit PU in a suspended state via the support member (not shown), although it is omitted in the drawings such as FIG. 2 from the viewpoint of avoiding intricacy of the drawings. Incidentally, in the case when the exposure apparatus in FIG. 1 employs a configuration where projection unit PU is supported in a suspended state with respect to mainframe 41 as previously described, for example, head units 62A to 62D can be supported in a suspended state integrally with projection unit PU, or head units 62A to 62D can be arranged independently from projection unit PU at the measurement frame, supported in a suspended state from mainframe 41. Especially in the latter case, head units 62A to 62D and aligner 99 can each be arranged independently at the measurement frame, which is supported in a suspended state.

Head units 62A and 62C are respectively placed on the +X side and −X side of projection unit PU having the longitudinal direction in the X-axis direction, and are also placed apart at the substantially same distance from optical axis AX of projection optical system PL symmetrically with respect to optical axis AX of projection optical system PL. Further, head units 62B and 62D are respectively placed on the +Y side and −Y side of projection unit PU having the longitudinal direction in the Y-axis direction, and are also placed apart at substantially the same distance from optical axis AX of projection optical system PL symmetrically, with respect to optical axis AX of projection optical system PL.

Head units 62A and 62C are each equipped with a plurality of (six in this case) Y heads 64 that are placed at a predetermined distance on a straight line (reference axis) LH that passes through optical axis AX of projection optical system PL and is parallel to the X-axis. Head units 62A and 62C each constitute a multiple-lens (six-lens, in this case) Y linear encoder that measures the position (Y position) of wafer stage WST (wafer table WTB) in the Y-axis direction, using Y scales 39Y$_1$ and 39Y$_2$ previously described. In this case, the spacing between adjacent Y heads 64 (measurement beams) is set smaller than the width of Y scales 39Y$_1$ and 39Y$_2$ previously described in the X-axis direction.

Head unit 62B is equipped with a plurality of (in this case, seven) X heads 66, placed at a predetermined spacing on reference axis LV. Further, head unit 62D is equipped with a plurality of (eleven in this case) (however, out of the eleven X heads, three X heads that overlap primary alignment system is AL1 are not shown in FIG. 2) X heads 66 that are placed on reference axis LV at a predetermined spacing. Head units 62B and 62D each constitute a multiple-lens (seven-lens (eleven-lens), in this case) X linear encoder that measures the position in the X-axis direction (the X-position) of wafer stage WST (wafer table WTB) using X scales 39X$_1$ and 39X$_2$ previously described. Incidentally, the spacing between adjacent X heads 66 (measurement beams) is set smaller than the width of X scales 39X$_1$ and 39X$_2$ previously described in the Y-axis direction.

Furthermore, on the −X side of secondary alignment sensor AL2$_1$ and on the +X side of secondary alignment sensor AL2$_4$, Y heads 64$y_1$ and 64$y_2$ are respectively arranged, whose detection points are placed on a straight line parallel to the X-axis that passes through the detection center of primary alignment system AL1 and are substantially symmetrically placed with respect to the detection center. In the state shown in FIG. 2 where the center of wafer W on wafer stage WST is on reference axis LV, Y heads 64$y_1$ and 64$y_2$ face Y scales 39Y$_2$ and 39Y$_1$, respectively. On an alignment operation (to be described later) or the like, Y scales 39Y$_2$ and 39Y$_1$ are placed facing Y heads 64$y_1$ and 64$y_2$ respectively, and the Y-position (and the θz rotation) of wafer stage WST is measured by Y heads 64$y_1$ and 64$y_2$ (Y linear encoder).

The measurement values of each of the linear encoders described above are supplied to the controller (not shown), and the controller controls the position of wafer table WTB within the XY plane, based on the measurement values of each of the linear encoders. Incidentally, at least during the exposure operation, as well as position control of wafer stage WST within the XY plane (the X-axis, the Y-axis, and the θz directions) using encoder system previously described, position control of wafer stage WST in the Z-axis, the θx, and the θy directions can be performed using other measurement devices. In this case, as other measurement devices, the wafer stage interferometer system previously described, or a multiple point focal position detection system and the like disclosed in, for example, U.S. Pat. No. 5,448,332 and the like can be used. In the case of arranging this multiple point focal position detection system, at least a part of a plurality of measurement points can be set within liquid immersion area 14 (or exposure area IA), or all the measurement points can be set outside of liquid immersion area 14.

Further, in the embodiment, at the time of baseline measurement of the secondary alignment systems (to be described later) or the like, a pair of reference gratings 52 of CD bar 46 face Y heads 64$y_1$ and 64$y_2$, respectively, and the Y-position of CD bar 46 is measured by Y heads 64$y_1$ and 64$y_2$ and the pair of reference gratings 52. These measurement values are supplied to the controller (not shown), and the controller controls the θz rotation of CD bar 46 based on these measurement values.

In the embodiment, because the arrangement of the X heads and Y heads described above is employed, in the effective stroke range (a range in which the stage moves for alignment and exposure operation) of wafer stage WST, X scales $39X_1$ and $39X_2$ face head units 62B and 62D (X head 66), respectively, without fail, and Y scales $39Y_1$ and $39Y_2$ face head units 62A and 62C (Y head 64) or Y heads $64y_1$ and $64y_2$, respectively. Incidentally, in FIG. 2, for the convenience of the drawing, although projection unit PU and alignment systems AL1 and $AL2_1$ to $AL2_4$ are shown distanced apart in the Y-axis direction, alignment systems AL1 and $AL2_1$ to $AL2_4$ are actually placed closer to projection unit PU than when compared to FIG. 2.

Therefore, by controlling the linear motor and the like that drive wafer stage WST based on the measurement values of these encoders in the effective stroke range of wafer stage WST, the controller (not shown) can control the position (including the θz rotation) of wafer stage WST within the XY plane with high precision. Further, when wafer stage WST moves within the effective stroke range, the measurement values of the X head or the Y head just before the opposing state with the X scale or the Y scale is released are succeeded to the measurement values of the X head or the Y head that newly face the X scale or the Y scale.

Incidentally, the encoder system having the head unit described above will hereinafter be appropriately referred to as a "stage encoder," including the scale previously described.

In exposure apparatus 100 of the embodiment, as shown in FIG. 2, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, U.S. Pat. No. 5,448,332 and the like. This multipoint AF system has at least a plurality of measurement points placed apart in the X-axis direction in the embodiment.

Next, a concrete configuration and the like of aligner 99 shown in FIG. 1 will be described, referring to FIGS. 3 to 9.

Figure 3:
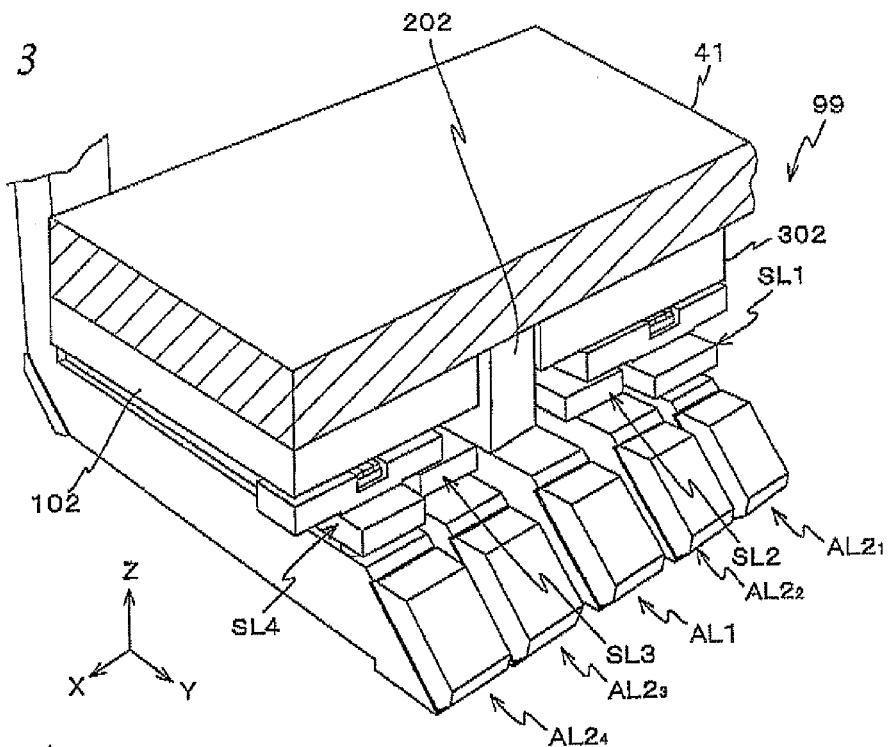
FIG. 3 is a perspective view that shows showing aligner 99.

FIG. 3 shows a perspective view of aligner 99 in a state where mainframe 41 is partially broken. As described above, aligner 99 is equipped with primary alignment system AL1 and four secondary alignment systems $AL2_1$, $AL2_2$, $AL2_3$, and $AL2_4$. The two secondary alignment systems $AL2_1$ and $AL2_2$ placed on the −X side of primary alignment system AL1 and the two secondary alignment systems $AL2_3$ and $AL2_4$ placed on the +X side have a symmetric configuration centered on primary alignment system AL1.

As it can be seen from FIG. 5 which shows a state when primary alignment system AL1 is seen from the +X side, primary alignment system AL1 is supported by suspension on the lower surface of mainframe 41 via a support member 202. As this primary alignment system AL1, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signals from this primary alignment system AL1 are supplied to the controller (not shown).

Referring back to FIG. 3, sliders SL1 and SL2 are fixed to the upper surface of secondary alignment systems $AL2_1$ and $AL2_2$, respectively. On the +z side of sliders SL1 and SL2, an FIA surface plate 302 is arranged fixed to the lower surface of mainframe 41. Further, sliders SL3 and SL4 are fixed to the upper surface of secondary alignment systems $AL2_1$ and $AL2_4$, respectively. On the +Z side of sliders SL3 and SL4, an FIA surface plate 102 is arranged fixed to the lower surface of mainframe 41.

Hereinafter, details on a configuration and the like of these secondary alignment systems $AL2_1$ to $AL2_4$ will be described concretely, taking up secondary alignment systems $AL2_4$ and $AL2_3$.

Figure 4:
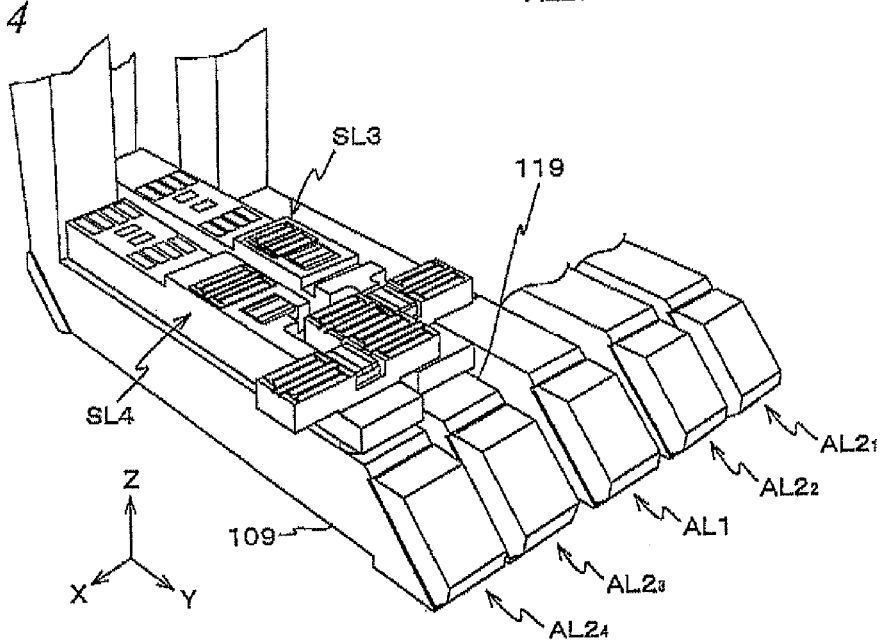
FIG. 4 is a perspective view that shows alignment systems $AL1$, and $AL2_1$ to $AL2_4$.
Figure 9:
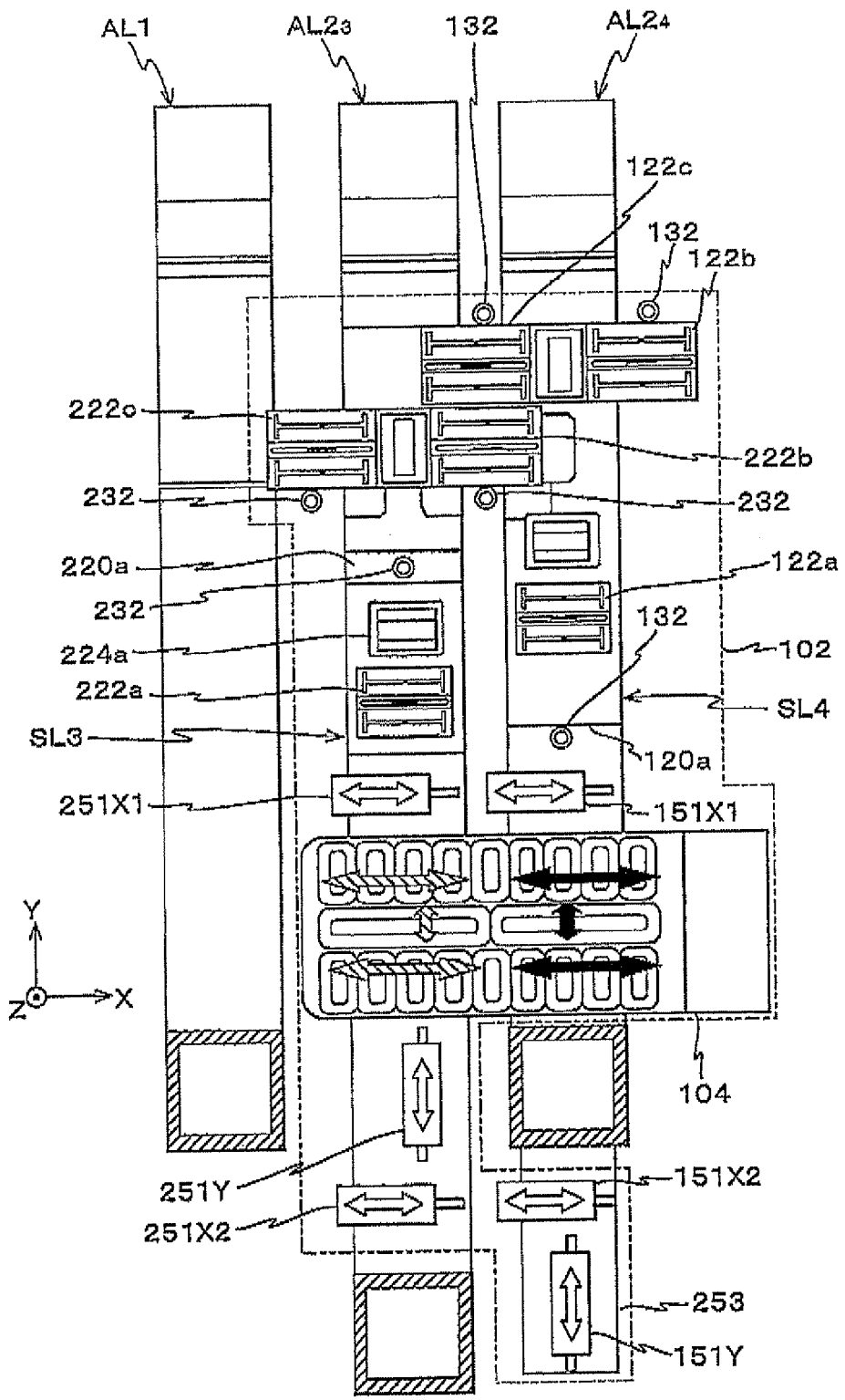
FIG. 9 is a planar view that shows alignment systems AL1, $AL2_3$, and $AL2_4$.

FIG. 4 is a perspective view of primary alignment system AL1 and secondary alignment systems $AL2_1$ to $AL2_4$, with some parts such as FIA surface plates 102 and 302 omitted, and FIG. 6 is a view which shows a state of secondary alignment system $AL2_4$ being viewed from the +X direction. Further, FIG. 9 is a planar view which shows secondary alignment systems $AL2_3$ and $AL2_4$ and sliders SL3 and SL4.

Secondary alignment system $AL2_4$ is an FIA system like primary alignment system AL1, and includes a roughly L-shaped barrel 109 in which an optical member such as a lens has been arranged as shown in FIGS. 4 and 6. On the upper surface (a surface on the +Z side) of the portion extending in the Y-axis direction of barrel 109, slider SL4 previously described is fixed, and this slider SL4 is arranged facing FIA surface plate 102 previously described (refer to FIG. 6).

FIA surface plate 102 is made of a member (e.g. Invar and the like) which is a magnetic material also having a low thermal expansion, and an armature unit 104 (refer to FIGS. 6 and 9) including a plurality of armature coils are arranged in a part of the platform (near the end on the −Y side). One end of liquid supply pipe 63a and liquid exhaust pipe 63b are each connected to FIA surface plate 102, and after liquid for cooling supplied via liquid supply pipe 63a from a liquid supply device (not shown) goes along the passage formed throughout the inside of FIA surface plate 102, the liquid is exhausted via liquid exhaust pipe 63b. Accordingly, the temperature of FIA surface plate 102 is controlled (cooled) by the liquid for cooling, and is set to a predetermined temperature. Incidentally, the temperature adjustment device of FIA surface plate 102 is not limited to this configuration, and for example, a Peltier element can also be used.

Figure 7A:
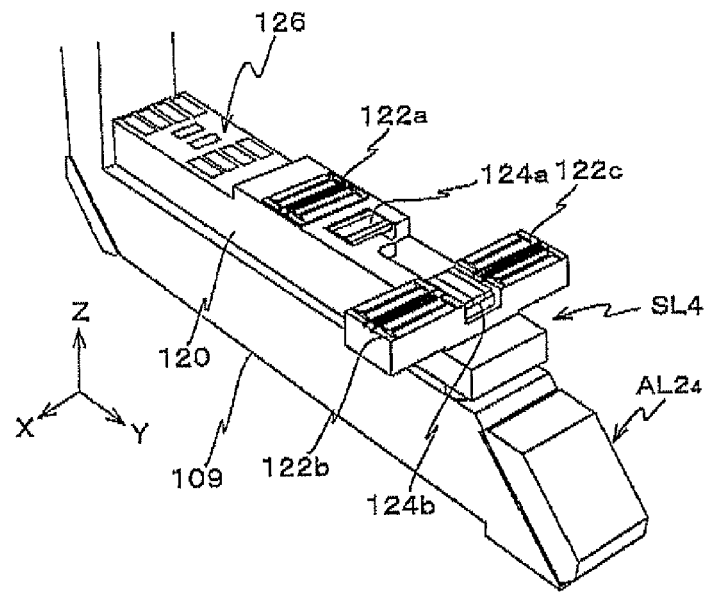
FIG. 7A is a perspective view which shows alignment system $AL2_4$ extracted from FIG. 4.

As shown in the perspective view in FIG. 7A, slider SL4 includes a slider main section 120, and three static gas bearings 122a, 122b, and 122c, two permanent magnets 124a and 124b, and a magnetic pole unit 126 which are arranged in slider main section 120.

Figure 8:
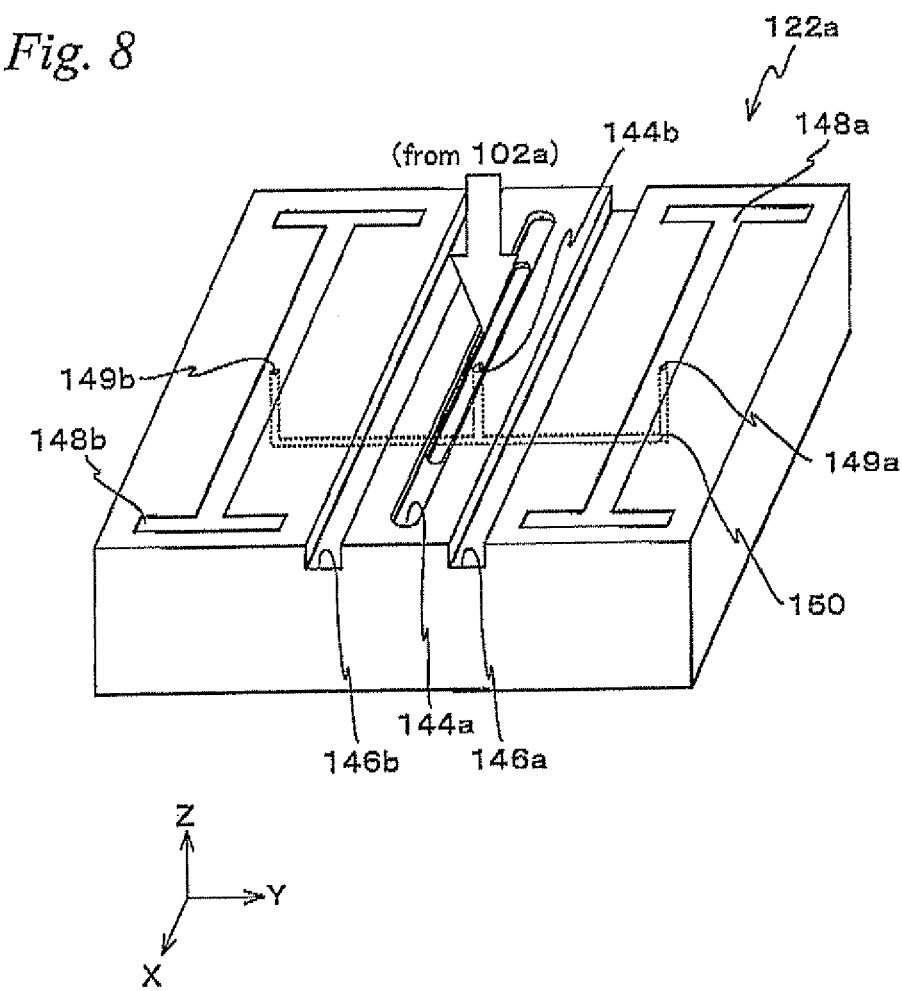

As shown enlarged in FIG. 8, static gas bearing 122a is made, for example, of a roughly rectangular-parallelepiped shape, and in the center of the surface (a surface on the +Z side), a pressure receiving groove 144a extending in the x-axis direction is formed. Further, at positions a predetermined distance away on the +Y side and the −Y side of pressure receiving groove 144a, atmospheric air release grooves 146a and 146b extending in the X-axis direction are formed, and on the +Y side of one of the atmospheric air release groove 146a and the −Y side of the other atmospheric air release groove 146b, preloaded grooves 148a and 148b which are I-shaped in a planar view (when viewed from the +Z side) are formed, respectively.

In the center portion of pressure receiving groove 144a, an opening 144b is formed, and in the center portion of preloaded grooves 148a and 148b, orifices 149a and 149b are formed, respectively. Opening 144b and orifices 149a and 149b connect via pipe line 150 formed inside the static gas bearing, which allows gaseous circulation between each of the grooves.

The upper surface of static gas bearing 122a configured in the manner described above faces the lower surface of FIA surface plate 102, as shown in FIG. 6. Accordingly, by gas being supplied from an external gas supply device (not shown) to pressure receiving groove 144a of static gas bearing 122a via a pipe line 102a formed inside FIA surface plate 102, the gas which is supplied sequentially passes through opening 144b, pipe line 150, orifices 149a and 149b, and preloaded grooves 148a and 148b, and blows out toward the lower surface of FIA surface plate 102. More specifically, static gas bearing 122a is a static gas bearing to which no pipes are connected, or a static gas bearing of a so-called ground gas supply type.

Referring back to FIG. 7A, other static gas bearings 122b and 122c are also configured in the same manner as static gas bearing 122a. These static gas bearings 122a to 122c are arranged on slider main section 120 at three points (in the embodiment, positions corresponding to the apexes of an isosceles triangle) that are not on a straight line.

Of permanent magnets 124a and 124b provided on slider 120 in FIG. 7A, one of the permanent magnets 124a is placed near the +Y side of static gas bearing 122a, and the other permanent magnet 124b is placed at a position between static gas bearings 122b and 122c. In the embodiment, a placement is set where the midpoint of a line that joins the center of permanent magnet 124a and the center of permanent magnet 124b together coincides with a centroid of the isosceles triangle whose apexes are the three static gas bearings 122a to 122c. Because permanent magnets 124a and 124b are facing FIA surface plate 102 made of the magnetic material previously described, a magnetic attraction acts constantly between permanent magnets 124a and 124b and FIA surface plate 102.

According to these permanent magnets 124a and 124b and static gas bearings 122a to 122c, because a magnetic attraction constantly acts between permanent magnets 124a and 124b and FIA surface plate 102 as previously described, slider SL4 becomes closest to (in contact with) the lower surface of FIA surface plate 102 while gas is not supplied to static gas bearings 122a to 122c. More specifically, the clearance between slider SL4 and FIA surface plate 102 becomes substantially zero. Meanwhile, when gas is supplied to static gas bearings 122a to 122c, repulsion occurs between FIA surface plate 102 and slider SL4 due to static pressure of the gas. In this case, slider SL4 is maintained (held) in a state (a state shown in FIG. 6) where a predetermined clearance is formed between the upper surface of the slider and the lower surface of FIA surface plate 102 by a balance between the magnetic attraction and the static pressure (repulsion) of the gas. Hereinafter, the former is referred to as a "landed state", and the latter will be referred to as a "floating state". Incidentally, in the embodiment, while the clearance between slider SL4 and FIA surface plate 102 was formed by merely generating repulsion by the static pressure of the gas, as well as this, at least one of the magnetic attraction and the repulsion can also be adjusted. For example, merely the magnetic attraction can be adjusted without generating the repulsion, or the magnetic attraction can be constant with adjusting only the repulsion.

Magnetic pole unit 126 is arranged near the end on the −Y side of slider main section 120 as shown in FIG. 7A, and includes a plurality of (in the embodiment, ten) permanent magnets. The plurality of permanent magnets is embedded in slider main section 120. Of these permanent magnets, two magnets (Y drive magnets) arranged in the center of the Y-axis direction are of reversed polarity with each other, and in a pair of magnet groups (X drive magnet groups) in which a plurality of permanent magnets are arranged along the X-axis direction on the +Y side and the −Y side of the Y drive magnets, the adjacent magnets are of reversed polarity.

On the other hand, armature unit 104 arranged on the upper side of magnetic pole unit 126 is configured including a plurality of armature coils (refer to FIG. 9). The armature coils included inside armature unit 104 are two coils (Y drive coils) arranged in the center portion in the Y-axis direction, and a pair of coil groups (X drive coil groups) in which a plurality of coils are arranged along the X-axis direction on one side and the other side of the Y-axis direction, as shown in FIG. 9.

Between magnetic pole unit 126 and armature unit 104, a drive force in the X-axis direction and a drive force in the Y-axis direction can be applied to slider SL4 (refer to the blackened double-sided arrows in FIG. 9) by electromagnetic interaction between a magnetic field generated by the permanent magnets configuring the magnetic pole unit and the current which flows through the armature coils configuring armature unit 104. Further, by applying drive forces in the X-axis direction having different magnitudes at two places spaced apart by a predetermined distance in the Y-axis direction, a drive force in a rotational (θz) direction around the Z-axis can be applied to slider SL4. Incidentally, in the description below, a drive mechanism (an actuator) configured by magnetic pole unit 126 and armature unit 104 described above will be referred to as an "alignment system motor".

In the embodiment, as shown in FIG. 9, three stopper members 132 are arranged to limit a moving range of slider SL4 (secondary alignment system $AL2_4$). In the embodiment, as each of the stopper members 132, a rotating member which restricts the movement of slider SL4 by being pushed against a part of slider SL4 as in a cam follower is used. Accordingly, in the description below, each stopper member will be referred to as a cam follower for the sake of convenience.

More specifically, cam followers 132 are each arranged near the +Y side of static gas bearing 122b, near the +Y side of static gas bearing 122c, and near the −Y side of a step portion 120a formed at a position between static gas bearing 122a of slider main section 120 and magnetic pole unit 126, respectively. These three cam followers 132 are actually supported in a suspended state from the lower surface of FIA surface plate 102 previously described When slider SL4 (secondary alignment system $AL2_4$) is located at the position shown in FIG. 9, there is a clearance, for example, of around 0.1 mm, between the respective three 132 cam followers, and static gas bearings 122 and 120 or step portion 120a. That is, by the three cam followers 132 described above, a movement range in the Y-axis direction of secondary alignment system $AL2_4$ is limited, for example, to the range of around 0.2 mm.

The position of secondary alignment system $AL2_4$ (slider SL4) in the X-axis direction is measured by a pair of X-axis alignment system encoders (hereinafter referred to as "X-axis encoders") 151X1 and 151X2 shown in FIG. 9, and the position in the Y-axis direction is measured by Y-axis alignment system encoder (hereinafter referred to as a "Y-axis encoder") 151Y (the outlined double-sided arrows in FIG. 9 show measurement directions). In the embodiment, because two X-axis encoders are used, not only the position in the X-axis direction of secondary alignment system $AL2_4$, but also the position in the θz direction (the rotational direction around the Z-axis) can be measured by using these measurement values.

X-axis encoders 151X1 and 151X2 and Y-axis encoder 151Y have an encoder head including a light source and a photoreceiver and the like arranged (supported in a suspended state) on the FIA surface plate 102 side previously described, and a linear scale on which a diffraction grating and the like is formed on its surface is arranged on the secondary alignment system $AL2_4$ (or slider SL4) side. Incidentally, the linear scales of X-axis encoder 151X2 and Y-axis encoder 151Y are actually arranged on the upper surface (a surface on the +Z side) of a plate-shaped member 253 fixed to the end surface on the −Y side of barrel 109 as shown in FIG. 9, and facing these linear scales, the encoder heads are supported by suspension by FIA surface plate 102.

The measurement values of these encoders (151X1, 151X2, and 151Y) are each sent to a controller (not shown). Then, on moving secondary alignment system $AL2_4$, the controller supplies gas to static gas bearings 122a to 122c previously described, and by forming a predetermined clearance between sliders SL3 and SL4 and FIA surface plate 102, makes slider SL3 move into the floating state described above. By controlling the electric current supplied to armature unit 104 configuring the alignment system motor based on the measurement values in a state maintaining the floating state, the controller finely drives slider SL4 (secondary alignment system $AL2_4$) in the X-axis, the Y-axis and the θz directions.

Referring back to FIG. 4, secondary alignment system $AL2_3$ placed on the −X side of secondary alignment system $AL2_4$ is also an FIA system as in secondary alignment system $AL2_4$, and includes a roughly L-shaped barrel 119 in which an optical member such as a lens has been arranged inside. On the upper surface (the surface on the +Z side) of barrel 119 at the portion extending in the Y-axis direction, slider SL3 previously described is fixed to be in a nested state with slider SL4. The upper surface of slider SL3 faces a part of the lower surface of FIA surface plate 102 (refer to FIGS. 3 and 9).

Figure 7B:
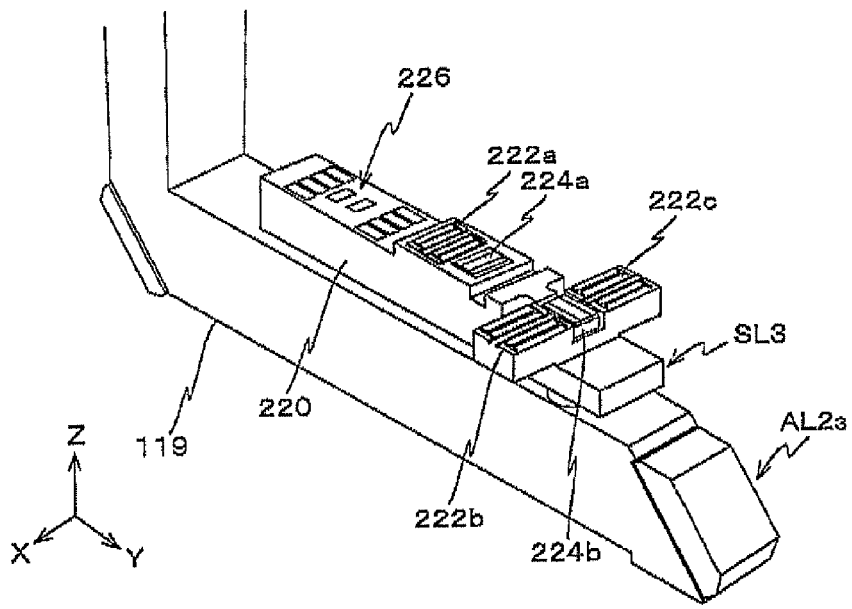

Although the placement of the static gas bearings and the permanent magnets and the like differ slightly, slider SL3 has a configuration approximately the same as slider SL4 previously described. More specifically, as shown in FIG. 7B, slider SL3 includes a slider main section 220, three static gas bearings 222a to 222c arranged in slider main section 220, two permanent magnets 224a and 224b, and a magnetic pole unit 226 including a plurality of permanent magnets. In this case, the static gas bearings and the permanent magnets are placed so that the midpoint of a line that joins the center of permanent magnet 224a and the center of permanent magnet 224b together coincides with a centroid of the isosceles triangle whose apexes are the three static gas bearings 222a to 222c.

Because magnetic pole unit 226 faces armature unit 104 arranged in FIA surface plate 102 as previously described, a drive force in the X and Y-axis directions and in the θz direction can be applied to slider SL3 (refer to the hatched double-sided arrows in FIG. 9) by electromagnetic interaction between a magnetic field generated by the permanent magnets configuring magnetic pole unit 226 and the current which flows through the armature coils configuring armature unit 104. Incidentally, in the description below, armature unit 104 and magnetic pole unit 226 are collectively referred to as an "alignment system motor".

The position of secondary alignment system $AL2_3$ in the X-axis direction and the θz direction is measured by a pair of X-axis alignment system encoders (hereinafter referred to as "X-axis encoders") 251X1 and 251X2 shown in FIG. 9, and the position in the Y-axis direction is measured by Y-axis alignment system encoder (hereinafter referred to as a "Y-axis encoder") 251Y (the outlined double-sided arrows in FIG. 9 show measurement directions of each of the encoders). In each of the encoders 251X1, 251X2, and 251Y, an encoder head including a light source and a photoreceiver and the like is arranged (supported in a suspended state) on the FIA surface plate 102 side previously described, and a linear scale is arranged on the secondary alignment system $AL2_4$ (or slider SL4) side.

The measurement values of each of the encoders 251X1, 251X2, and 251Y are sent to the controller (not shown). The controller finely drives slider SL3 (secondary alignment system $AL2_3$) in the X-axis, the Y-axis, and the θz directions by controlling the electric current supplied to armature coil 104 configuring the alignment system motor based on the measurement values of encoders 251X1, 251X2, and 251Y, in a state where slider SL3 of secondary alignment system $AL2_3$ is levitated.

Furthermore, as shown in FIG. 9 cam flowers 232 are each arranged on the −Y side of static gas bearing 222b and on the −Y side of static gas bearing 222c of slider SL3, and inside recessed groove 220a formed at a position on the +Y side of permanent magnet 224a of slider main section 220. These three cam followers 232 are supported in a suspended state from the lower surface of FIA surface plate 102, as in cam followers 132 previously described. The width of recessed groove 220a in the Y-axis direction is set, for example, 0.2 mm larger than the diameter (outer diameter) of cam follower 232. When slider SL3 (secondary alignment system $AL2_3$) is located at the position shown in FIG. 9, there is a clearance, for example, of around 0.1 mm, between the respective three cam followers 232, the −Y side surface of static gas bearings 222b, the −Y side surface of static gas bearings 222c, and the +Y side surface of recessed section 120. Accordingly, by the three cam followers 232, a movement range in the Y-axis direction of secondary alignment system $AL2_3$ is limited, for example, to the range of around 0.2 mm.

Referring back to FIG. 3, secondary alignment systems $AL2_1$ and $AL2_2$ also have a configuration like secondary alignment systems $AL2_3$ and $AL2_4$ described above, while slider SL2 has a configuration in symmetry with slider SL3 described above and slider SL1 has a configuration in symmetry with slider SL4 described above. Further, the configuration of FIA surface plate 302 is in symmetry with the configuration of FIA surface plate 102 described above.

Next, a reset operation and a calibration method of the alignment system encoder described above will be described.

Reset Operation of an Alignment System Encoder

Reset operation in the embodiment, for example, is an operation performed when switching off the power of the overall exposure apparatus 100, at the time of startup of the exposure apparatus and the like.

In the embodiment, a reset operation of an alignment system encoder which measures a position of two secondary alignment systems (in this case, secondary alignment systems $AL2_3$ and $AL2_4$) of the four secondary alignment systems is described, based on FIGS. 10A to 10D.

Figure 10A:
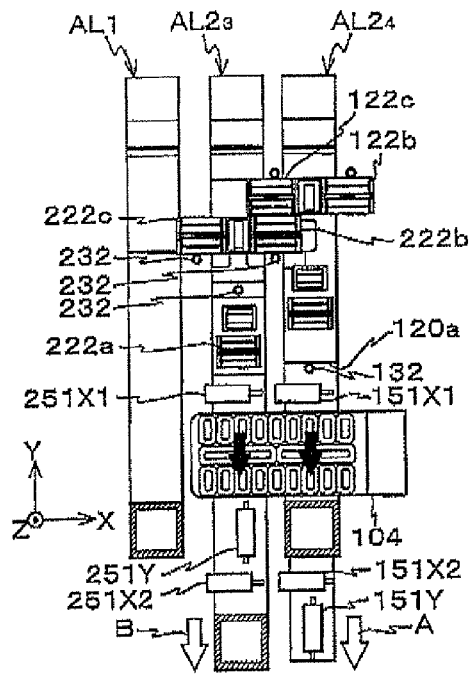
FIGS. 10A to 10D are views to explain a reset operation of the alignment system encoder.

First of all, the controller controls the current supplied to armature unit 104 configuring the alignment system motor and moves secondary alignment system $AL2_4$ to a movement limit position (the position where step portion 120a of slider main section 120 and cam follower 132 are in contact) on one side of the Y-axis direction (in this case, the −Y side) as shown by the outlined arrow A in FIG. 10A, and then performs magnetic pole alignment of armature unit 104 and magnetic pole unit 126 at this position. Further, the controller controls the current supplied to armature unit 104, and moves secondary alignment system $AL2_3$ to a movement limit position (the position where the surface on the −Y side of static gas bearings 222b and 222c of slider SL3 and cam follower 232 are in contact) on one side of the Y-axis direction (the −Y side) as shown by the outlined arrow B in FIG. 10A, and then performs magnetic pole alignment of armature unit 104 and magnetic pole unit 226 at this position.

Figure 10B:
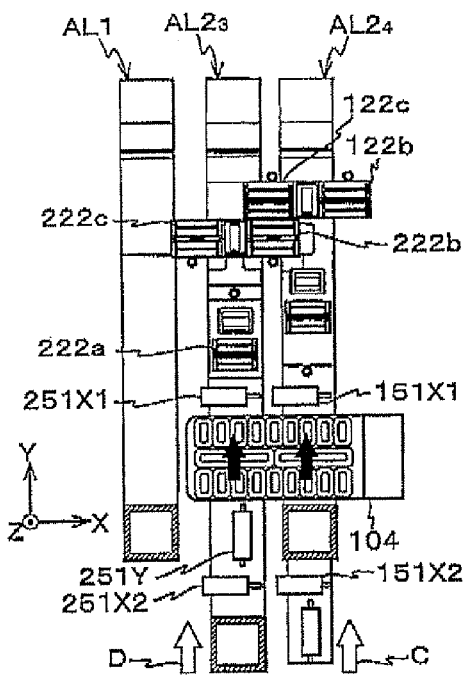
Figure 10C:
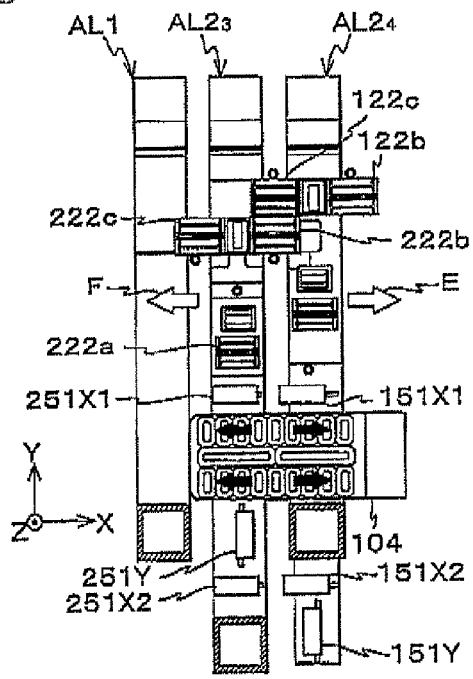

Subsequently, the controller controls the current supplied to armature unit 104 and moves secondary alignment system $AL2_4$ to the other side of the Y-axis direction (the +Y side) by a predetermined distance (for example, half the distance of the distance in which secondary alignment system $AL2_4$ can move in the Y-axis direction) (refer to the outlined arrow C in FIG. 10B), as well move secondary alignment system $AL2_3$ to the other side of the Y-axis direction (the +Y side) by a distance the same as the predetermined distance (refer to the outlined arrow D in FIG. 10B).

Subsequently, the controller controls the current to supply to armature unit 104, and by moving secondary alignment system $AL2_4$ to a movement limit position (the position where a surface on the +X side of static gas bearing 122b contacts a pin-shaped stopper member (not shown)) on one side of the X-axis direction (in this case, the +X side) (refer to the outlined arrow E in FIG. 10C), as well as moving secondary alignment system $AL2_3$ to a movement limit position (the position where a surface on the −X side of static gas bearing 222c contacts a pin-shaped stopper member (not shown)) on one side of the X-axis direction (in this case, the −X side) (refer to the outlined arrow F in FIG. 10C), searches for a stroke end in the X-axis direction of both of the secondary alignment systems $AL2_3$ and $AL2_4$.

Figure 10D:
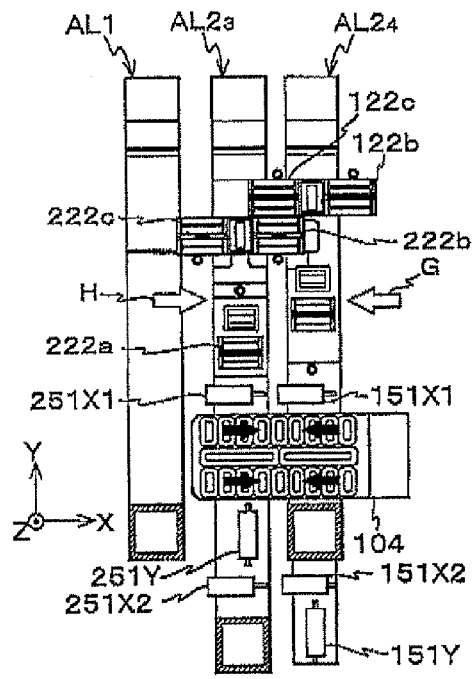

Then, the controller performs an origin search of X-axis encoders 151X1 and 151X2 while moving secondary alignment system $AL2_4$ in the −X direction (refer to the outlined arrow G in FIG. 10D), as well as performs an origin search of X-axis encoders 251X1 and 251X2 while moving secondary alignment system $AL2_3$ in the +X direction (refer to the outlined arrow H in FIG. 10D).

Reset of the encoder can be performed in the manner described.

Incidentally, in the description above, while the movement was performed in the order of secondary alignment system $AL2_4$ and then secondary alignment system $AL2_3$, as well as this, in the case the current can be supplied separately to the armature coils in armature unit 104 that face each of the secondary alignment systems, the secondary alignment systems can be moved simultaneously.

Incidentally, reset operation can be performed similarly for the encoder which measures a position of secondary alignment systems $AL2_1$ and $AL2_2$.

Calibration Operation

Next, a calibration of an alignment system encoder which performs position measurement of secondary alignment system $AL2_n$ (n=1 to 4) in the embodiment, or more specifically, X-axis encoders (151X1, 151X2, 251X1, and 251X2) and Y-axis encoders (151Y and 251Y), will be described.

This calibration is an operation to make a running (a measurement axis) of an alignment system encoder correspond with (associate with) a running (a measurement axis) of a wafer stage (a stage encoder).

First of all, the controller moves wafer stage WST to a position where an alignment mark formed on a wafer is positioned in the center of a detection area (field of view) of one (secondary alignment system $AL2_n$) of the four secondary alignment systems.

Then, the controller makes wafer stage WST and secondary alignment system $AL2_n$ move, for example, in the X-axis direction at the same speed (that is, makes wafer stage WST follow secondary alignment system $AL2_n$), while maintaining the state where the alignment mark coincides with the field center of secondary alignment system $AL2_n$.

While wafer stage WST and secondary alignment system $AL2_n$ are moved in this manner, the controller measures a position of wafer stage WST within the XY plane using the stage encoder described above, and also measures a position of secondary alignment system $AL2_n$ using the alignment system encoder, and computes a relation between the measurement results by both encoders.

Further, in a similar manner, the controller makes wafer stage WST and secondary alignment system $AL2_n$ move in the Y-axis direction at the same speed while maintaining the state where the alignment mark coincides with the field center of secondary alignment system $AL2_n$, and computes a relation between measurement results of the stage encoder and measurement results of the alignment system encoder at that time.

Further, the controller computes a relation between the measurement results of the alignment system encoder and the stage encoder in the manner described above also for the alignment system encoders of the other three secondary alignment systems.

When the controller performs position adjustment of secondary alignment system $AL2_n$ which will be described later on, position control of secondary alignment system $AL2_n$ is performed taking into consideration the relation between the measurement results of the stage encoder and the measurement results of the alignment system encoder computed in the manner described above. This makes it possible to perform position control of secondary alignment system $AL2_n$ in a state where the running of the alignment system encoder corresponds to the running (the running of the stage encoder) of wafer stage WST.

Incidentally, in the description above, while calibration of the alignment system encoder was performed using the alignment mark on the wafer, besides this, a reference mark (FIA mark) can be arranged on wafer table WTB, and calibration can be performed in the manner described above using the mark. Further, in the case when the scale of the stage encoder previously described is arranged also on the upper surface of measurement stage MST, calibration can be performed in the manner described above using reference mark M of CD bar 46 of measurement stage MST.

Further, in the example above, while the secondary alignment system was moved to follow wafer stage WST so that the state where the center of the field of the secondary alignment system and the mark (the alignment mark of the wafer or the reference mark) on wafer stage WST coincide is maintained, besides this, for example, wafer stage WST and secondary alignment system can be moved in a predetermined direction to be the same speed with the running of the stage encoder and the alignment system encoder serving as a reference, so that the mark does not move out of the field of the secondary alignment system. And then, a relative positional relation between the field center of the secondary alignment system and the reference mark at this time can be measured, and calibration of the alignment system encoder can be performed also using the measurement results. Calibration similar to the example above can also be performed in such a manner.

Incidentally, when performing the calibration as described above, wafer stage WST and secondary alignment system can be moved serially, or discretely (intermittently) at a predetermined interval (or a random interval).

Next, a baseline measurement operation of secondary alignment system $AL2_n$ (n=1-4), which is mainly performed just before starting the processing to the wafer of each lot (the beginning of a lot) will be described. In this case, the baseline of secondary alignment system $AL2_n$ refers to a relative position of (the detection center of) each secondary alignment system $AL2_n$, with (the detection center of) primary alignment system AL1 serving as a reference. Incidentally, measurement (a baseline check) of the baseline (positional relation (or the distance) between a projection position of a pattern (for example, the pattern of reticle R) by projection optical system PL and the detection center of primary alignment system AL1) of primary alignment system AL1 is to be performed already. Further, the position in the X-axis direction of secondary alignment system $AL2_n$ (n=1-4) is to be set, for example, by the alignment system motor previously described driving the system in accordance with the shot map information of the wafer within the lot.

Figure 11A:
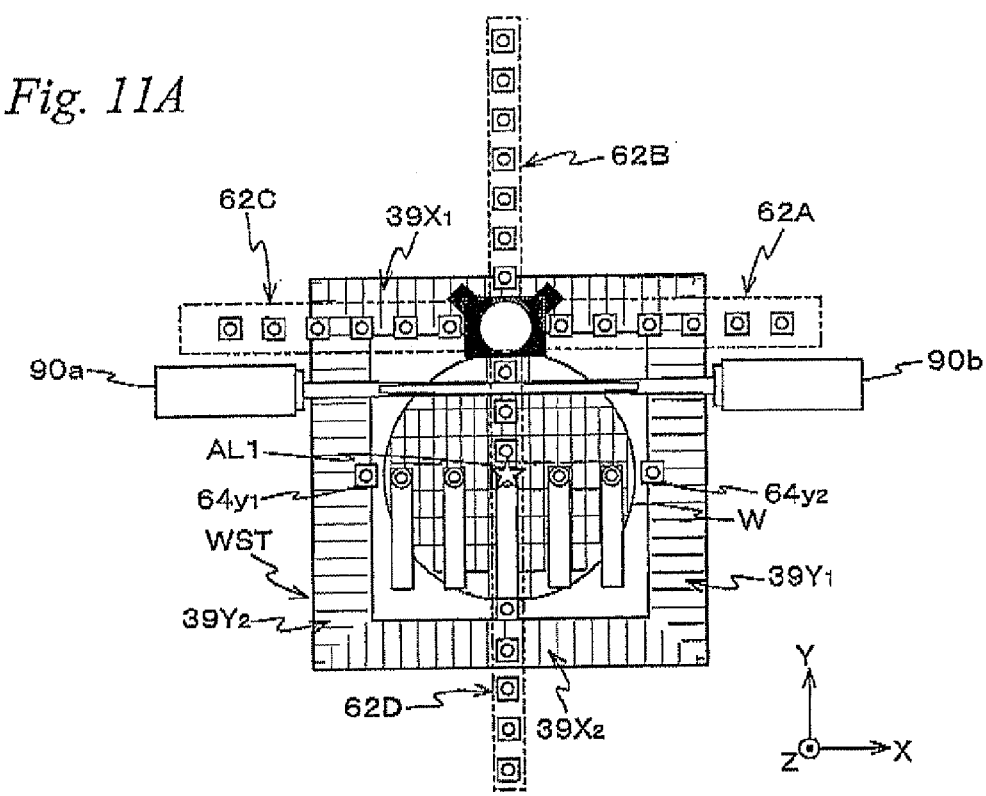
FIGS. 11A and 11B are views to explain a baseline measurement operation of secondary alignment systems performed to a wafer at the head of a lot.
Figure 11B:
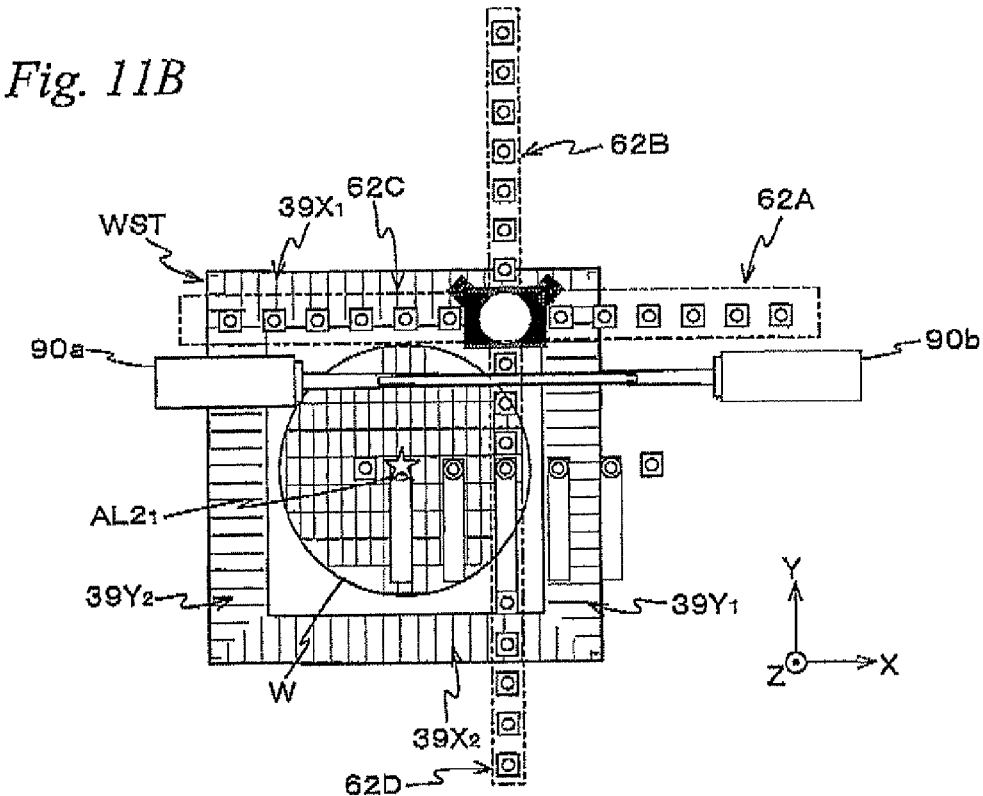

On the baseline measurement of the secondary alignment system performed to the wafer at the head of a lot (hereinafter, also referred to as "Sec-BCHK" as needed), first of all, as is shown in FIG. 11A, the controller detects a specific alignment mark on wafer W (process wafer) at the head of a lot with primary alignment system AL1 (refer to a star-shaped mark in FIG. 11A), and then, the controller makes the detection results correspond to the measurement values of the stage encoders above at the time of the detection, and stores them in memory. Subsequently, the controller moves wafer stage WST in the −X direction by a predetermined distance, and as is shown in FIG. 11B, detects the specific alignment mark with secondary alignment system $AL2_1$ (refer to a star-shaped mark in FIG. 11B), and makes the detection results correspond to the measurement values of the stage encoder described above, and stores them in memory.

Similarly, the controller moves wafer stage WST in the +X direction and sequentially detects the specific alignment mark with the remaining secondary alignment systems $AL2_2$, $AL2_3$ and $AL2_4$, and then sequentially makes the detection results correspond to the measurement values of the stage encoder at the time of the detection and stores them in memory, and based on the processing results, the controller computes the baseline of each secondary alignment system $AL2_n$.

In this manner, because the baseline of each secondary alignment system $AL2_n$ is obtained by detecting the same alignment mark on wafer W with primary alignment system AL1 and each secondary alignment system $AL2_n$ using wafer W (process wafer) at the beginning of a lot, by this measurement, the difference in detection offset among the alignment systems caused by the process can be consequently corrected. Incidentally, baseline measurement of secondary alignment system $AL2_n$ may also be performed using a reference mark on wafer stage WST or measurement stage MST, instead of the alignment mark on the wafer. Further, in the embodiment, because primary alignment system AL1 and secondary alignment system $AL2_n$ can each detect a two-dimensional mark (X, Y), by using the two-dimensional mark at the time of baseline measurement of secondary alignment system $AL2_n$, the baseline of secondary alignment system $AL2_n$ in the X-axis and the Y-axis directions can be obtained simultaneously.

Next, a Sec-BCHK operation, which is performed at predetermined timing during the processing of wafers in a lot, for example, a period from when exposure of a water ends until when the loading of the next wafer on wafer table WTB is completed (that is, during wafer replacement) will be described. In this case, because the Sec-BCHK is performed at intervals of each wafer replacement, hereinafter the Sec-BCHK is also referred to as the Sec-BCHK (interval).

Figure 12:
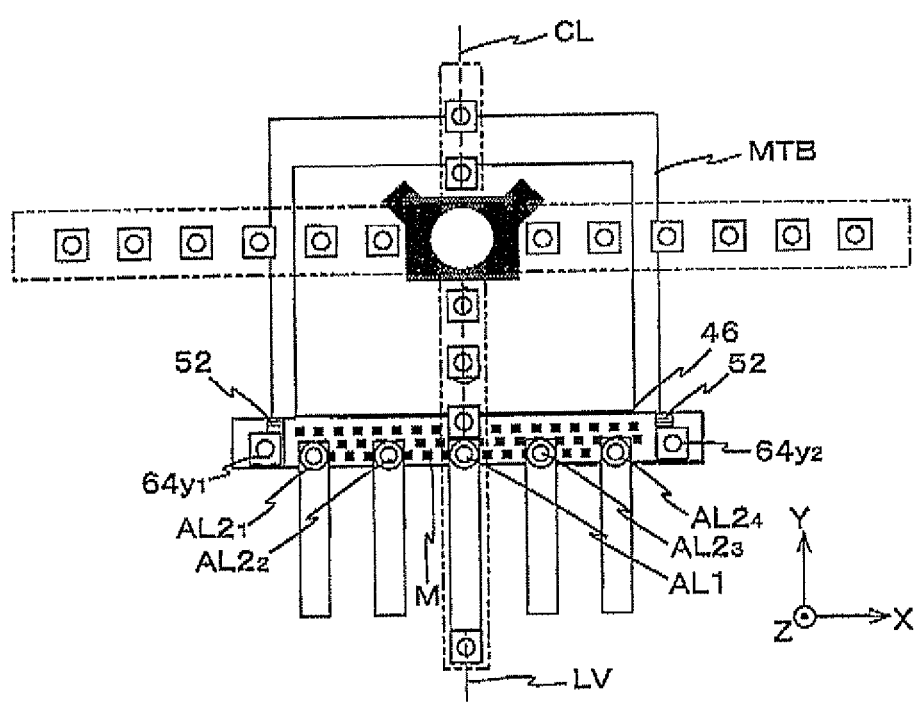
FIG. 12 is a view used to explain a baseline check operation of the secondary alignment systems performed at every wafer replacement.

On this Sec-BCHK (interval), as is shown in FIG. 12, the controller moves measurement stage MST so that reference axis LV on which the detection center of primary alignment system AL1 is placed substantially coincides with centerline CL and also CD bar 46 faces primary alignment system AL1 and secondary alignment system $AL2_n$. Then, the controller adjusts the θz rotation of CD bar 46 based on the measurement values of the pair of reference gratings 52 on CD bar 46 and Y heads $64y_1$ and $64y_2$ that face the pair of reference gratings 52, respectively, and also adjusts the XY position of CD bar 46, based on the measurement values of primary alignment system AL1 that detects reference mark M located on or in the vicinity of centerline CL of measurement table MTB. This adjustment is performed, for example, by adjusting the position of CD bar 46 (measurement stage MST) while monitoring the measurement values of the interferometer.

Then, in this state, the controller obtains each of the baselines of the four secondary alignment systems $AL2_1$ to $AL2_4$, by simultaneously measuring reference mark M on CD bar 46 that is located within the field of each of the secondary alignment systems using the four secondary alignment systems $AL2_1$ to $AL2_4$ Then, on the subsequent processing, drift of the baselines of four secondary alignment systems $AL2_3$ to $AL2_4$ is corrected by using the newly measured baselines.

Incidentally, while the Sec-BCHK (interval) described above is to be performed by simultaneous measurement of different reference marks by a plurality of secondary alignment systems, besides this, the baselines of the four secondary alignment systems $AL2_1$ to $AL2_4$ can each be obtained by sequentially (non-simultaneously) measuring the same reference mark M on CD bar 46 with a plurality of secondary alignment systems.

Figure 13A:
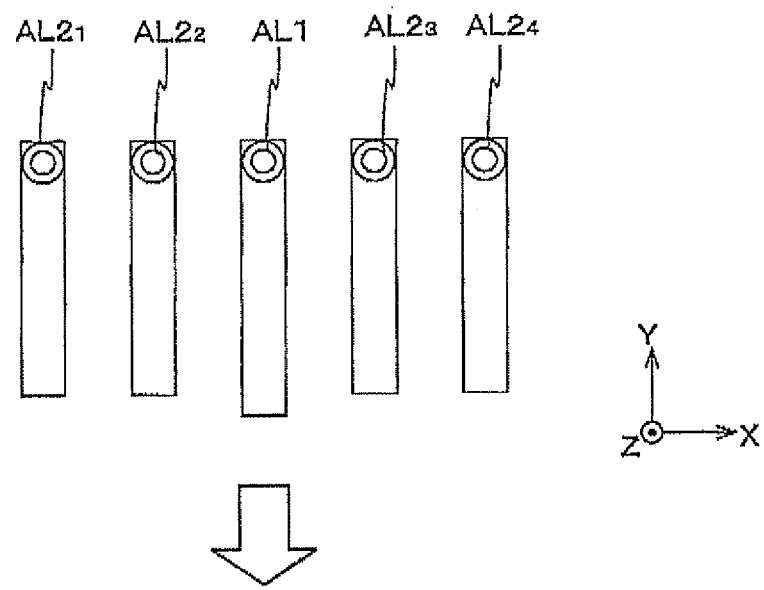
FIGS. 13A and 13B are views used to explain an operation of position adjustment of the secondary alignment system.
Figure 13B:
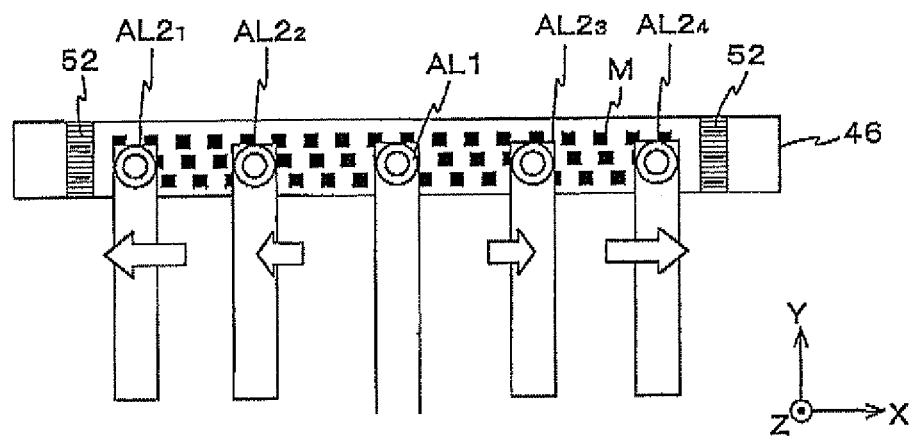

Next, an operation of position adjustment of secondary alignment system $AL2_n$ will be briefly described based on FIGS. 13A and 13B.

As a premise, positional relation between primary alignment system AL1 and the four secondary alignment systems $AL2_1$ to $AL2_4$ before adjustment is to be the positional relation shown in FIG. 13A.

The controller moves measurement stage MST so that primary alignment system AL1 and the four secondary alignment systems $AL2_1$ to $AL2_4$ are located above CD bar 46, as shown in FIG. 13B. Next, as in the case of Sec-BCHK (interval) described above, the controller adjusts the θz rotation of CD bar 46 based on the measurement values of the Y-axis linear encoder (Y heads $64y_1$ and $64y_2$), and also adjusts the XY position of CD bar 46 in the manner previously described, based on the measurement values of primary alignment system AL1 that detects reference mark M located on or in the vicinity of centerline CL of measurement table MTB. At the same time, the controller makes each secondary alignment system $AL2_n$ move (and/or rotate) at least in the X-axis direction as shown by an arrow in FIG. 13B, based on a shot map information which includes information of the size and placement (more specifically, placement of the alignment marks on the wafer) of the alignment shot area on the wafer which is subject to the next exposure. In this case, the controller supplies gas to the static gas bearings provided in sliders SL1 to SL4 so that the sliders are in a floating state as previously described, and secondary alignment system AL2n is driven by supplying current to armature unit 104a while maintaining the floating state. Accordingly, a baseline of secondary alignment system $AL2_n$, or in other words, a position of the detection area within the XY plane is adjusted (changed) in accordance with an alignment mark arranged in the alignment shot area which should be detected.

Then, after adjusting the baseline of secondary alignment system $AL2_n$ in this way, the controller makes sliders SL1 to SL4 land on the lower surface of FIA surface plates 102 and 302. On this landing, in the embodiment, the controller stops supplying the gas to the static gas bearings, while controlling the current supplied to the armature unit configuring the alignment system motor and maintaining the position of secondary alignment system $AL2_n$ within the XY plane.

This makes it possible for secondary alignment system $AL2_n$ (slider) to land on the FIA surface plate in a state where the position of each secondary alignment system $AL2_n$ within the XY plane is maintained.

Further, in the embodiment, in order to keep the heat generated in the encoder from affecting the detection accuracy of the alignment system, the power of the alignment system encoder is to be switched off when the position of secondary alignment system $AL2_n$ within the XY plane is not measured (while sliders SL1 to SL4 are landed on FIA surface plates 102 and 302). More specifically, for example, during the position adjustment of secondary alignment system $AL2_n$ performed as described above, power continues to be supplied to the encoder, and at the point when the position adjustment has been completed, the power supply is to be switched off.

Therefore, the controller stores a count value of the encoder just before the power of the encoder is switched off, for example, by storing the value in a memory (not shown). Then, on performing position adjustment of secondary alignment system $AL2_n$ previously described, the count value which has been stored is to be set as an initial value of the encoder at the point when the power is to be supply into an encoder again.

By this operation, because the thermal influence to the alignment system due to the heat generated in the encoder can be suppressed as much as possible, and the reset operation to reset the encoder will no longer be necessary when the power begins to be supplied to the encoder again, it becomes possible to reduce the time required to perform a series of operations related to position adjustment of the secondary alignment system $AL2_n$.

Incidentally, in the description above, while reference marks M formed at different positions on CD bar 46 were detected simultaneously and individually with the five alignment systems AL1, and $AL2_1$ to $AL2_4$, besides this, the baseline of secondary alignment system $AL2_n$ can also be adjusted by detecting alignment marks formed at different positions on wafer W (a process wafer) simultaneously and individually with the five alignment systems AL1, and $AL2_1$ to $AL2_4$, and adjusting the position of secondary alignment systems $AL2_1$ to $AL2_4$. Further, the baseline can be measured by detecting reference mark M again with secondary alignment system $AL2_n$, after having fixed secondary alignment system $AL2_n$ to the FIA surface plate. Furthermore, the baseline can be measured after moving secondary alignment system $AL2_n$ and fixing the system to the FIA surface plate based on the shot map information previously described and the measurement values of the alignment system encoder, without using the reference marks of CD bar 46.

In exposure apparatus 100 of the embodiment, a parallel processing operation that uses wafer stage WST and measurement stage MST is performed During the parallel processing operation, the position of wafer stage WST within the XY plane is measured mainly using the stage encoder described above, and in the range where the stage encoder cannot be used, the position is measured using the wafer stage interferometer system, Further, measurement stage MST is measured using the measurement stage interferometer system. And, in exposure apparatus 100 of the embodiment, liquid immersion area 14 is formed using local liquid immersion device 8 on the wafer mounted on wafer stage WST, and exposure operation of the wafer is performed with illumination light IL, via projection optical system PL and liquid Lq of liquid immersion area 14. The controller performs the exposure operation, based on results of wafer alignment (EGA) that has been performed beforehand by alignment systems AL1, and $AL2_1$ to $AL2_4$ and on the latest baseline and the like of alignment systems AL1, and $AL2_1$ to $AL2_4$, by repeating a movement operation between shots in which wafer stage WST is moved to a scanning starting position (an acceleration starting position) for exposure of each shot area on wafer W, and a scanning exposure operation in which a pattern of reticle R is transferred onto each shot area by a scanning exposure method. Subsequently, the controller performs the Sec-BCHK (interval) in which relative positions of the four secondary alignment systems with respect to primary alignment system AL1 are measured, using CD bar 46 supported by measurement stage MST, while loading (or exchange) of the wafer on wafer stage WST is being performed.

Furthermore, when wafer stage WST which has completed wafer loading (or exchange) moves directly under alignment systems AL1, $AL2_1$ and $AL2_4$, the controller performs an alignment operation in the manner described below.

Figure 14A:
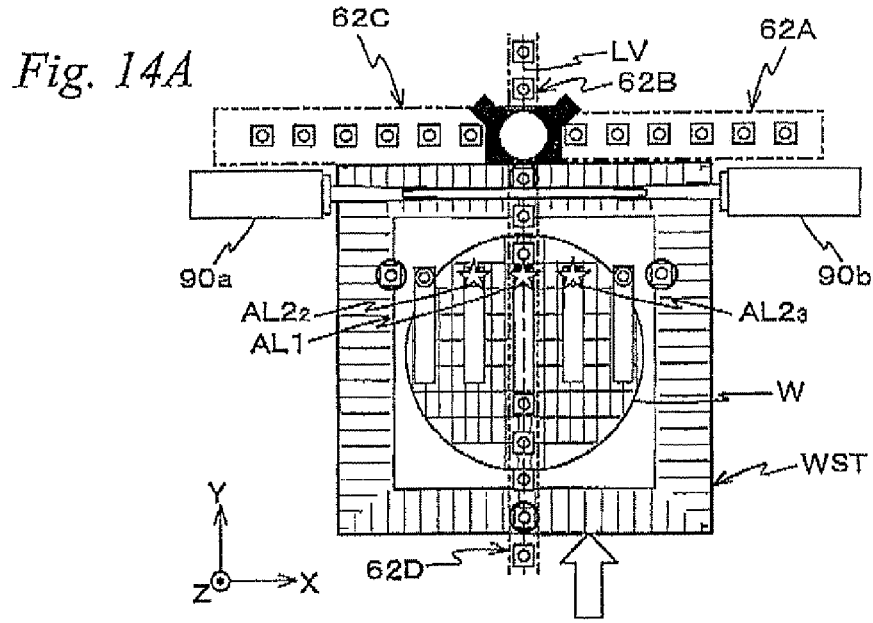
FIGS. 14A to 14C are views used to explain a wafer alignment performed in an exposure apparatus related to the embodiment.
Figure 14B:
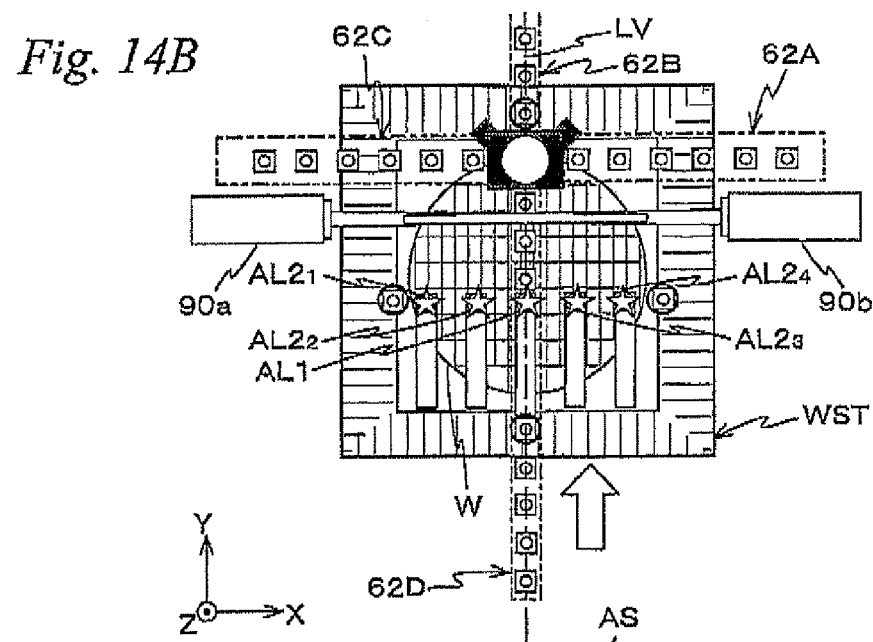
Figure 14C:
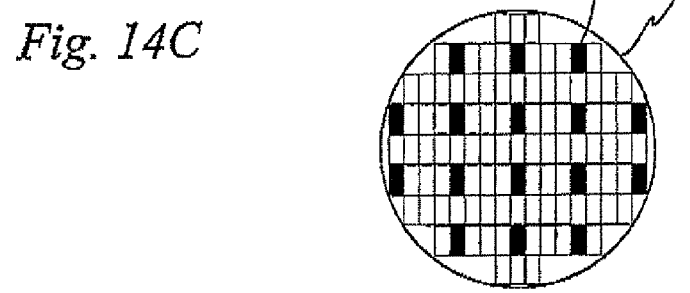

Incidentally, in the alignment operation of the embodiment, 16 shot areas AS, which are colored on wafer W on which a plurality of shot areas is formed in a layout (shot map) shown in FIG. 14C, serve as alignment shot areas. Incidentally, in FIGS. 14A and 14B, the illustration of measurement stage MST is omitted.

As a premise, position adjustment (position adjustment using the alignment system motor) in the X-axis direction of secondary alignment systems $AL2_1$ to $AL2_4$ is to be performed beforehand, in accordance with the placement of alignment shot areas AS.

First of all, the controller moves wafer stages WST positioned at a loading position (not shown) (the lower right hand side in FIG. 14A), slightly lower (a predetermined position (alignment starting position) where the center of wafer W is located on reference axis LV) than the position shown in FIG. 14A. This movement is performed, based on the positional information of the wafer stage measured using the stage encoder described above and the wafer stage interferometer system (or only the wafer stage interferometer system).

Next, the controller moves wafer stage WST in the +Y direction by a predetermined distance based on the measurement values of the stage encoder, and sets the position of wafer stage WST at a position shown in FIG. 14A, and almost simultaneously and individually detects the alignment marks arranged in three first alignment shot areas AS (refer to the star-shaped marks in FIG. 14A) using primary alignment system AL1 and secondary alignment systems $AL2_2$ and $AL2_3$, and then links the detection results of the three alignment systems AL1, and $AL2_2$ and $AL2_3$ above and the measurement values of the stage encoder at the time of the detection and stores them in memory (not shown). Incidentally, secondary alignment systems $AL2_1$ and $AL2_4$ at both ends which are not detecting any alignment marks can be made not to irradiate, or to irradiate detection beams on wafer table WTB (or the wafer). Further, in the wafer alignment in the embodiment, the position of wafer stage WST in the X-axis direction is set so that primary alignment system AL1 is placed on the centerline of wafer table WTB, and primary alignment system AL1 detects the alignment mark in the alignment shot area that is located on a meridian of the water.

Next, the main controller moves wafer stage WST in the +Y direction by a predetermined distance based on the measurement values of the stage encoder above, and sets the position of wafer stage WST at a position at which five alignment systems AL1 and $AL2_1$ to $AL2_4$ can almost simultaneously and individually detect the alignment marks arranged in the five second alignment shot areas AS on wafer W, and almost simultaneously and individually detects the five alignment marks using five alignment systems AL1 and $AL2_1$ to $AL2_4$, and then links the detection results of five alignment systems AL1 and $AL2_1$ to $AL2_4$ and the measurement values of the stage encoder at the time of the detection and stores them in memory (not shown).

Next, the controller moves wafer stage WST in the +Y direction by a predetermined distance based on the measurement values of the stage encoder above, and sets the position of wafer stage WST at a position at which five alignment systems AL1 and $AL2_1$ to $AL2_4$ can almost simultaneously and individually detect the alignment marks arranged in the five third alignment shot areas AS on wafer W, and almost simultaneously and individually detects the five alignment marks (refer to star-shaped marks in FIG. 14B) using five alignment systems AL1 and $AL2_1$ to $AL2_4$, and then links the detection results of five alignment systems AL1 and $AL2_1$ to $AL2_4$ and the measurement values of the stage encoder above at the time of the detection and stores them in memory (not shown).

Next, the controller moves wafer stage WST in the +Y direction by a predetermined distance based on the measurement values of the stage encoder above, and sets the position of wafer stage WST at a position at which the alignment marks arranged in the three fourth alignment shot areas AS on wafer W can be almost simultaneously and individually detected using primary alignment system AL1 and secondary alignment systems $AL2_2$ and $AL2_3$, and almost simultaneously and individually detects the three alignment marks using three alignment systems AL1, $AL2_2$ and $AL2_3$, and then links the detection results of three alignment systems AL1, $AL2_2$ and $AL2_3$ and the measurement values of the stage encoder above at the time of the detection and stores them in memory (not shown).

Then, the controller computes an array (coordinate values) of all the shot areas on water W on a coordinate system (for example, an XY coordinate system using the optical axis of projection optical system PL as its origin) that is set by the measurement axes of the stage encoder (four head units) above, by performing a statistical computation by the EGA method, which is disclosed in, for example, Kokai (Japanese Unexamined Patent Application Publication) No. 61044429 (the corresponding U.S. Pat. No. 5,243,195) and the like, using the detection results of a total of 16 alignment marks and the corresponding measurement values of the stage encoder above obtained in the manner described above, and the baseline of secondary alignment system $AL2_n$.

As is described above, in the embodiment, by moving wafer stage WST in the +Y direction and setting the position of wafer stage WST at four points on the moving route, position information of alignment marks in the alignment shot areas AS at 16 points in total can be obtained in a remarkably shorter period of time, compared with the case where a single alignment system sequentially detects alignment marks at 16 points. In this case, for example, as it is easier to understand in particular when considering alignment systems AL1, $AL2_2$ and $AL2_3$, each of alignment systems AL1, $AL2_2$ and $AL2_3$ detects a plurality of alignment marks arrayed along the Y-axis direction that are sequentially placed within the detection area, associated with the operation of moving wafer stage WST described above. Therefore, on position measurement of the alignment marks described above, it is not necessary to move wafer stage WST in the X-axis direction.

Further, in this case, because the number of detection points (the number of measurement points) of alignment marks on wafer W that are almost simultaneously detected by a plurality of alignment systems differs depending on the position within the XY plane of wafer stage WST (the Y-position in particular (i.e. the access degree of wafer W to a plurality of alignment systems), when moving wafer stage WST in the Y-axis direction that is orthogonal to the array direction (X-axis direction) of a plurality of alignment systems, the marks at positions different from one another on wafer W can be detected in accordance with the position of wafer stage WST in the Y-axis direction, or in other words, can be detected simultaneously using the required number of alignment systems, in accordance with the shot array on water W.

Incidentally, in the embodiment, while wafer stage WST moves in the alignment described above, multipoint AF system consisting of irradiation system 90*a* and photodetection system 90*b* is used to obtain the Z position of the entire surface of wafer W.

Then, the controller performs liquid immersion exposure by the step-and-scan method based on the measurement results of water alignment (EGA) and the baseline of the primary alignment system measured beforehand and the like previously described, and sequentially transfers a reticle pattern onto a plurality of shot areas on water W. Afterwards, similar operations are repeatedly performed to the remaining wafers within the lot. Incidentally, the control in the Z-axis direction of wafer stage WST during exposure is performed using other measurement devices previously described that perform position control in the Z-axis, the θx, and the θy directions, based on the Z position of the entire surface of wafer W obtained during the alignment using the multipoint AF system.

As described in detail so far, according to the embodiment, secondary alignment system $AL2_n$ is supported in a state where a predetermined clearance is formed between FIA surface plates 102 and 302 by static gas bearings and permanent magnets which sliders SL1 to SL4 are equipped with, and secondary alignment system $AL2_n$ which is supported is driven within the XY plane by an alignment system motor. More specifically, because secondary alignment system $AL2_n$ (sliders SL1 to SL4) is driven with respect to FIA surface plates 102 and 302 in a non-contact states a highly precise movement (positioning) of secondary alignment system $AL2_n$ becomes possible. Further, by setting the static pressure (repulsion) of gas from the static gas bearings small when compared with the magnetic attraction between the permanent magnets and FIA surface plates 102 and 302, it is also possible to fix (land) secondary alignment system $AL2_n$ in a state where the system is positioned at an arbitrary position with high precision.

Further, according to the embodiment, because the secondary alignment system can be positioned with high precision according to the shot array on the water, an alignment highly precise within a short time can be performed, by performing an alignment operation using the primary alignment system and the secondary alignment system. Further, by using the alignment results, exposure with high throughput and high precision can be achieved.

Further, in the embodiment, because the three static gas bearings provided in each slider are placed at positions which are the apexes of an isosceles triangle, and further, the two permanent magnets provided in each slider are placed so that the midpoint of a line that joins the center of each of the permanent magnets coincides with a centroid of the isosceles triangle, the attraction and the repulsion can be made to act on the same point of action, which makes it possible to perform a stable floating and landing operation of the sliders.

Further, according to the embodiment, because the power of the alignment system encoder is to be switched off in a state where the position of the secondary alignment system is set, the influence to the measurement accuracy of the secondary alignment system by the heat generation in the encoder can be lowered as much as possible. Further, because the measurement values of the encoder just before switching off the power of the encoder is stored, and the measurement values which were stored are set as initial values when the encoder is switched on again, initial setting such as the reset operation and the like of the encoder does not have to be performed each time the power is turned on.

Further, in the embodiment, because calibration of the alignment system encoder is performed by moving wafer W (wafer stage WST) in a predetermined direction while measuring the position of wafer W using a stage encoder, along with moving the secondary alignment system while measuring the position of the secondary alignment system using the alignment system encoder so that the position of a mark within the detection field of the secondary alignment system is maintained constantly (to be located in the field center), it becomes possible to perform measurement in a state where the running of the alignment system encoder corresponds to the running of the wafer stage WST (running of the stage encoder). Accordingly, by taking the measurement results into consideration, position control of the secondary alignment system using the alignment system encoder can be performed with high precision. Further, by performing a wafer alignment using the secondary alignment system, exposure with high precision can be performed.

Furthermore, in the embodiment, because magnetic pole alignment of the alignment system motor is performed before performing origin search of the encoder when the alignment system encoder is resets an adjusted state where the secondary alignment system can be driven with high precision within the horizontal plane is made on the origin search. Further, because the origin is searched while moving the secondary alignment system from a state where the system is moved to a movement limit position on one side of the X-axis direction, to the other side of the X-axis direction, an origin search which uses the movement limit position as a reference can be performed. Accordingly, an origin search of a highly precise measurement device can be performed.

Incidentally, in the embodiment above, while the case has been described where in the case position adjustment of the secondary alignment system is performed, gas is supplied to the static gas bearings which makes the sliders levitate from the FIA surface plate, and when position adjustment is not performed, gas is not supplied to the static gas bearings and the sliders are in a landed state on the FIA surface plate, besides this, gas can be supplied to the static gas bearings even when position adjustment is not performed to maintain the floating state.

Incidentally, in the embodiment above, the case has been described where a mechanism including a FIA surface plate (a magnetic material) and a permanent magnet provided in a slider was employed as a mechanism to generate an attraction between the FIA surface plate and the slider. However, the present invention is not limited to this, and instead of the permanent magnet, for example, an electromagnet can be used. Further, the permanent magnet (or electromagnet) can be provided in the FIA surface plate side, and the magnetic material can be provided in at least a part of the slider. Furthermore, as the attraction, besides the magnetic attraction, for example, an electrostatic force or vacuum suction force and the like can also be used. Further, in the embodiment above, while the case has been described where the FIA surface plate in itself is made of a magnetic material, as well as this, the FIA surface plate can be configured of a nonmagnetic material, and a magnetic material can be provided separately on the lower surface side of the FIA surface plate. Incidentally, in the configuration of the embodiment above, because magnetic force between the permanent magnets and the magnetic material is utilized as the attraction between the FIA surface plate and the sliders, the secondary alignment systems $AL2_1$ to $AL2_4$ will not be dropped or damaged even when a blackout occurs. Further, the magnitude of the attraction (magnetic force) between the permanent magnet and the magnetic material does not have to be constant and can be variable.

Further, in the embodiment above, the case has been described where a mechanism including static gas bearings arranged in a slider was adopted as a mechanism to generate repulsion between the FIA surface plate and the sliders, and the repulsion was static pressure of the gas. However, the present invention is not limited to this, and for example, the static gas bearings can be arranged in the FIA surface plate side. Further, as the repulsion, for example, a magnetic repulsive force (a repulsive force which occurs by a combination and the like of a permanent magnet and an electromagnet) can be employed besides the static pressure of the gas. Further, in the embodiment above, while a static gas bearing of a so-called ground gas supply type was used as the static gas bearings to supply gas from the FIA surface plate side, besides this, piping a for gas supply can also be connected directly to the static gas bearings.

Further, in the embodiment above, while the case has been described where three static gas bearings and two permanent magnets are arranged in each slider, besides this, an arbitrary number of static gas bearings and permanent magnets can be arranged. Further, the placement of the static gas bearings and the permanent magnets is not limited to the configuration described above.

Incidentally, in the embodiment above, while the case has been described where the alignment system encoder was used as the position measurement system which measures the position of the secondary alignment system in the XY plane, instead of this, other measurements device such as an interferometer and the like can also be used. Further, in the embodiment above, while the power of the alignment system encoder was switched off to suppress the influence of heat to the detection precision of the alignment system when the position of secondary alignment system $AL2_n$ within the XY plane was not measured, switching off of the power of the encoder is not essential. For example, in the case the heat is not a problem, or when the heat source (light source and a detector) of the encoder is placed externally, switching off the power supply may be unnecessary.

Further, the calibration of the alignment system encoder, magnetic pole alignment, and the origin search are not limited to the ones described above.

Incidentally, in the embodiment above, while the entire secondary alignment system can be fixed to the slider, only a part of the system, such as for example, an optical system inside barrel 109 can also be fixed to the slider.

Incidentally, in the embodiment above, while the case has been described where aligner 99 is equipped with tour secondary alignment systems, the number of the secondary alignment systems can be arbitrary. Further, the number of primary alignment systems AL1 is not limited to one and a plurality of systems can be used, and a configuration drivable within the XY plane as in the secondary alignment system can be employed.

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed.

Incidentally, in the embodiment above, while the case has been illustrated where the slider faces the FIA surface plate, the fixed portion of the support device which supports the movable alignment system is not limited to a surface plate. For example, in the case the static gas bearing is used to generate the repulsion, as long as it is a member having a plane around a level which can function as a pressure receiving surface, it can be used as the fixed portion. In the case of using magnetic force as the attraction, at least a part of the member should be configured of a magnetic material.

Incidentally, in the embodiment above, while a nozzle unit that has a lower surface where the wafer faces was used, a configuration having multiple nozzles as disclosed in, for example, the pamphlet of International Publication No. 99/49504, can also be employed. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, and the liquid immersion mechanism disclosed in the EP Patent Publication No. 1420298 can also be applied to the exposure apparatus of the embodiment.

Incidentally, in the embodiment above, the case has been described where Sec-BCHK (interval) is performed using CD bar 46 on the measurement stage MST side while each wafer is exchanged on the wafer stage WST side, however, the present invention is not limited to this, and at least one of an illuminance irregularity measurement (and illuminance measurement), aerial image measurement, wavefront aberration measurement and the like can be performed using a measuring instrument of measurement stage MST, and the measurement results can be reflected in the exposure of the wafer performed later on. To be more concrete, for example, projection optical system PL can be adjusted based on the measurement results. Further, the liquid immersion area can be held on measurement stage MST during the wafer exchange, and when wafer stage WST is place directly under projection unit PU on exchange with the measurement stage, the liquid immersion area on the measurement stage can be moved onto the wafer stage.

Incidentally, in the embodiment, while the case has been described where wafer stage WST includes stage main section 91 and wafer table WTB, a single stage that can move in six degrees of freedom can also be employed as wafer stage WST. Incidentally, instead of a reflection surface, a movable mirror consisting of a plane mirror can be arranged in wafer table WTB. Further, as a configuration of the measurement stage, the present invention is not limited to the one described in the embodiment above, and for example, measurement stage MST can employ the so-called coarse and fine movement structure in which measurement table MTB can be finely driven in the X-axis direction, the Y-axis direction, and the θz direction with respect to stage main section 92, or measurement table MTB can be fixed to stage main section 92, and stage main section 92 including measurement table MTB and can be configured drivable in directions of six degrees of freedom.

Further, in the embodiment above, an encoder system which has an encoder head arranged on a wafer table as well as a scale on which a one-dimensional or a two-dimensional grating (for example, a diffraction grating) is formed that is placed above the wafer table facing the encoder head can be used, as in the third embodiment or as is disclosed in, for example, the U.S. Patent Application Publication No. 2006/0227309 and the like. Further, the position of the wafer stage can be controlled by arranging only an interferometer system, without arranging both the encoder system and the interferometer system.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) the predetermined liquid to (with) pure water can be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected.

Further, in the embodiment above, the recovered liquid may be reused, and in this case, a filter that removes impurities from the recovered liquid is preferably arranged in a liquid recovery unit, a recovery pipe or the like. Furthermore, in the embodiment above, while the exposure apparatus was equipped with all of local liquid immersion device 8, the exposure apparatus does not have to be equipped with a part of (for example, liquid supply device and/or liquid recovery device and the like) local liquid immersion device 8, and these parts can be substituted by the equipment available in the factory where the exposure apparatus is installed.

Further, in the embodiment above, the case has been described where the exposure apparatus is a liquid immersion type exposure apparatus. However, the present invention is not limited to this, but can also be employed in a dry type exposure apparatus that performs exposure of wafer W without liquid (water). Further, the present invention can also be applied to an exposure apparatus which is not equipped with a measurement stage.

Further, in the embodiment above, the case has been described where the present invention is applied to a scanning exposure apparatus by a step-and-scan method or the like. However, the present invention is not limited to this, but may also be applied to a static exposure apparatus such as a stepper. Even with the stepper or the like, by measuring the position of a stage on which an object subject to exposure is mounted by encoders, generation of position measurement error caused by air fluctuations can substantially be nulled likewise. In this case, it becomes possible to set the position of the stage with high precision based on correction information used to correct short-term fluctuation of the measurement values of the encoders using the measurement values of the interferometers and based on the measurement values of the encoders, and as a consequence, highly accurate transfer of a reticle pattern onto the object can be performed. Further, the present invention can also be applied to an exposure apparatus by a step-and-stitch method that synthesizes a shot area and a shot area. Moreover, the present invention can also be applied to a multi-stage type exposure apparatus equipped with a plurality of wafer stages, as is disclosed in, for example, Kokai (Japanese Unexamined Patent Application Publications) No. 10-163099 and No. 10-214783 (the corresponding U.S. Pat. No. 6,590,634), Kohyo (published Japanese translation of International Publication for Patent Application) No. 2000-505958 (the corresponding U.S. Pat. No. 5,969,441), the U.S. Pat. No. 6,208,407, and the like.

Further, the magnification of the projection optical system in the exposure apparatus of the embodiment above is not limited only to a reduction system, but also can be either an equal magnifying system or a magnifying system, and the projection optical system is not limited only to a dioptric system, but also can be either a catoptric system or a catadioptric system, and the projected image can be either an inverted image or an upright image.

Further, illumination light IL is not limited to an ArF excimer laser beam (wavelength 193 nm), and can also be an ultraviolet light such as the KrF excimer laser beam (wavelength 248 nm), or a vacuum-ultraviolet light such as the $F_2$ laser beam (wavelength 157 nm). As is disclosed in, for example, the pamphlet of International Publication No. 99/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into the ultraviolet region using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm) t and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection patterns or an emission pattern is formed according to electronic data of the pattern that is to be exposed can also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns via a projection optical system and almost simultaneously performs double exposure of one shot area by one scanning exposure, as is disclosed in, for example, Kohyo (published Japanese translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied to an exposure apparatus for transferring a liquid crystal display device pattern onto a rectangular glass plate and an exposure apparatus for producing organic ELs, thin magnetic heads, imaging devices (such as CCDs), micromachines, DNA Chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Further, the exposure apparatus of the embodiment above is manufactured by assembling various subsystems, which include the respective constituents that are recited in the claims of the present application, so as to keep predetermined mechanical accuracy, electrical accuracy and optical accuracy. In order to secure these various kinds of accuracy, before and after the assembly, adjustment to achieve the optical accuracy for various optical systems, adjustment to achieve the mechanical accuracy for various mechanical systems, and adjustment to achieve the electrical accuracy for various electric systems are performed. A process of assembling various subsystems into the exposure apparatus includes mechanical connection, wiring connection of electric circuits, piping connection of pressure circuits and the like among various types of subsystems. Needless to say, an assembly process of individual subsystem is performed before the process of assembling the various subsystems into the exposure apparatus. When the process of assembling the various subsystems into the exposure apparatus is completed, a total adjustment is performed and various kinds of accuracy as the entire exposure apparatus are secured. Incidentally, the making of the exposure apparatus is preferably performed in a clean room where the temperature, the degree of cleanliness and the like are controlled.

Incidentally, the disclosures of the various publications, the pamphlets of the International Publications, and the U.S. Patent Application publication descriptions and the U.S. Patent descriptions that are cited in the embodiment above and related to exposure apparatuses and the like are each incorporated herein by reference.

Incidentally, semiconductor devices are manufactured through the steps of a step where the function/performance design of the wafer is performed, a step where a reticle based on the design step is manufactured a step where a wafer is manufactured using silicon materials, a lithography step where the pattern formed on the reticle by the exposure apparatus in the embodiment above is transferred onto an object such as the wafer, a device assembly step (including processes such as a dicing process, a bonding process, and a packaging process), inspection steps and the like. In this case, because a device pattern is formed on the object using the exposure apparatus in the embodiment above in the lithography step, it becomes possible to improve the productivity of highly integrated devices.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A holding apparatus that movably holds a detection system which detects a mark on an object, the apparatus comprising:
a support device which supports the detection system; and
a drive device which drives the detection system supported via a predetermined clearance by the support device at least in a uniaxial direction in a horizontal plane, wherein
the support device includes a force generation device which generates an attraction and a repulsion between the support device and the detection system.

2. The holding apparatus according to claim 1 wherein the support device supports the detection system by suspension with the attraction.

3. The holding apparatus according to claim 2 wherein the support device makes the clearance be approximately zero at a time when the detection system is fixed.

4. The holding apparatus according to claim 3 wherein the support device forms the clearance by adjusting a force between the support device and the detection system at a time of the drive.

5. The holding apparatus according to claim 2 wherein the detection system, and the support device adjusts at least one of the attraction and the repulsion to form the clearance.

6. The holding apparatus according to claim 5 wherein the support device makes the repulsion be approximately zero at a time when the detection system is fixed.

7. The holding apparatus according to claim 5 wherein the attraction and repulsion generated between the support device and the detection system substantially act on the same position of the detection system.

8. The holding apparatus according to claim 5, further comprising:
a controller which controls the drive device to maintain a position of the detection system within a horizontal plane substantially constant, during a time the repulsion is reduced to near zero while the attraction of the force generation device is generated.

9. The holding apparatus according to claim 2 wherein the force generation device generates a magnetic attraction as the attraction between the support device and the detection system.

10. The holding apparatus according to claim 9 wherein the force generation device has a magnetic material member which is provided in at least one of a fixed portion of the support device and the detection system, and a magnet member provided in the other of the fixed portion and the detection system.

11. The holding apparatus according to claim 2 wherein the force generation device includes a static gas bearing as a repulsion generation device which generates a repulsion between the support device and the detection system.

12. The holding apparatus according to claim 11 wherein the static gas bearing is arranged on the detection system.

13. The holding apparatus according to claim 12 wherein gas is supplied to the static gas bearing via a fixed portion of the support device on which the detection system is placed.

14. The holding apparatus according to claim 12 wherein the static gas bearing is arranged at three places of a predetermined plane of the detection system that faces a fixed portion of the support device.

15. The holding apparatus according to claim 2 wherein the force generation device has a plurality of permanent magnets arranged in the detection system as an attraction generation device which generates the attraction between the support device and the detection system and also has a plurality of air pads arranged in the detection system as a repulsion generation device which generates the repulsion between the support device and the detection system, whereby
a centroid of a figure which is formed by connecting positions of the plurality of permanent magnets and a centroid of a figure formed by connecting positions of the plurality of air pads substantially coincide with each other.

16. The holding apparatus according to claim 1 wherein the support device supports the detection system by suspension, the force generation device can generate forces in directions opposite to each other in a vertical direction between the support device and the detection system, and the clearance is maintained by both of the forces in directions opposite to each other at least during the drive.

17. The holding apparatus according to claim 16 wherein the support device adjusts at least one of the forces in directions opposite to each other to form the clearance.

18. The holding apparatus according to claim 16 wherein the support device makes the clearance be approximately zero at a time when the detection system is fixed.

19. The holding apparatus according to claim 16 wherein an attraction and a repulsion generated between the support device and the detection system substantially act on the same position of the detection system.

20. The holding apparatus according to claim 16, further comprising:
a controller which controls the drive device to maintain a position of the detection system within a horizontal plane substantially constant, during a time a repulsion of the force generation device is reduced to near zero while an attraction of the force generation device is generated.

21. The holding apparatus according to claim 16 wherein the force generation device generates a magnetic attraction as the attraction between the support device and the detection system.

22. The holding apparatus according to claim 21 wherein the force generation device has a magnetic material member which is provided in at least one of a fixed portion of the support device and the detection system, and a magnet member provided in the other of the fixed portion and the detection system.

23. The holding apparatus according to claim 16 wherein the force generation device includes a static gas bearing as a repulsion generation device which generates a repulsion between the support device and the detection system.

24. The holding apparatus according to claim 23 wherein the static gas bearing is arranged on the detection system.

25. The holding apparatus according to claim 24 wherein gas is supplied to the static gas bearing via a fixed portion of the support device on which the detection system is placed.

26. The holding apparatus according to claim 24 wherein the static gas bearing is arranged at three places of a predetermined plane of the detection system that faces a fixed portion of the support device.

27. The holding apparatus according to claim 16 wherein the force generation device has a plurality of permanent magnets arranged in the detection system as an attraction generation device which generates the attraction between the support device and the detection system and also has a plurality of air pads arranged in the detection system as a repulsion generation device which generates a repulsion between the support device and the detection system, whereby
a centroid of a figure which is formed by connecting positions of the plurality of permanent magnets and a centroid of a figure formed by connecting positions of the plurality of air pads substantially coincide with each other.

28. The holding apparatus according to claim 1 wherein the support device includes a surface plate on which the detection system is placed on a surface side substantially parallel to the horizontal plane, and the force generation device can generate an attraction and a repulsion between the surface plate and the detection system.

29. The holding apparatus according to claim 28 wherein the force generation device can adjust a magnitude of at least one of the attraction and the repulsion.

30. The holding apparatus according to claim 28 wherein the clearance is maintained between the detection system and the surface plate by a balance of the attraction and the repulsion generated by the force generation device.

31. The holding apparatus according to claim 28 wherein the detection system is placed on a lower surface side of the surface plate.

32. The holding apparatus according to claim 28 wherein the force generation device includes an attraction generation device which generates the attraction between the surface plate and the detection system, and a repulsion generation device which generates the repulsion between the surface plate and the detection system.

33. The holding apparatus according to claim 28 wherein the support device makes the clearance be approximately zero at a time when the detection system is fixed.

34. The holding apparatus according to claim 28 wherein the attraction and repulsion generated between the surface plate and the detection system substantially act on the same position of the detection system.

35. The holding apparatus according to claim 28, further comprising:
a controller which controls the drive device to maintain a position of the detection system within a horizontal plane substantially constant, during a time the repulsion is reduced to near zero while the attraction of the force generation device is generated.

36. The holding apparatus according to claim 28 wherein the force generation device generates a magnetic attraction as the attraction between the surface plate and the detection system.

37. The holding apparatus according to claim 36 wherein the force generation device has a magnetic material member which is provided in at least one of a fixed portion of the support device and the detection system, and a magnet member provided in the other of the fixed portion and the detection system.

38. The holding apparatus according to claim 28 wherein the force generation device includes a static gas bearing as a repulsion generation device which generates the repulsion between the surface plate and the detection system.

39. The holding apparatus according to claim 38 wherein the static gas bearing is arranged on the detection system.

40. The holding apparatus according to claim 39 wherein gas is supplied to the static gas bearing via a fixed portion of the support device on which the detection system is placed.

41. The holding apparatus according to claim 39 wherein the static gas bearing is arranged at three places of a predetermined plane of the detection system that faces a fixed portion of the support device.

42. The holding apparatus according to claim 28 wherein the force generation device has a plurality of permanent magnets arranged in the detection system as an attraction generation device which generates the attraction between the surface plate and the detection system and also has a plurality of air pads arranged in the detection system as a repulsion generation device which generates the repulsion between the surface plate and the detection system, whereby
a centroid of a figure which is formed by connecting positions of the plurality of permanent magnets and a centroid of a figure formed by connecting positions of the plurality of air pads substantially coincide with each other.

43. The holding apparatus according to claim 1, further comprising:
a restriction member which restricts movement of the detection system within the horizontal plane.

44. The holding apparatus according to claim 43 wherein the restriction member includes a cam follower shaped stopper member.

45. The holding apparatus according to claim 1, further comprising:
a measurement system which measures positional information of the detection system within the horizontal plane.

46. The holding apparatus according to claim 45 wherein the measurement system includes a linear encoder.

47. The holding apparatus according to claim 1 wherein a fixed portion of the support device on which the detection system is arranged has a pipe line inside through which a cooling medium passes.

48. The holding apparatus according to claim 1 wherein the drive device moves an optical system of the detection system, and makes a position of a detection area of the detection system variable.

49. A position detection apparatus comprising:
a detection system which detects a mark on an object; and
the holding apparatus according to claim 1 which movably holds the detection system.

50. An exposure apparatus that forms a pattern on a sensitive object by an irradiation of an energy beam, the apparatus comprising:
the position detection apparatus according to claim 49 which detects positional information of a mark on the sensitive object; and
a patterning device which irradiates the energy beam on the sensitive object using detection results by the position detection apparatus.

51. The exposure apparatus according to claim 50 wherein the position detection apparatus has a plurality of detection systems which has at least one detection system moved by the drive device, and the plurality of detection systems detects positional information of the mark on the sensitive object.

52. The exposure apparatus according to claim 51 wherein the drive device moves the at least one detection system so that different marks on the sensitive object can be simultaneously detected by at least two of the plurality of detection systems.

53. A device manufacturing method, the method including:
exposing a sensitive object using the exposure apparatus according to claim 50; and
developing the sensitive object which has been exposed.

54. An exposure method in which a pattern is formed on a sensitive object by an irradiation of an energy beam, the method comprising:
a detection process in which positional information of a mark of the sensitive object is detected, using a detection system which is movably held by the holding apparatus according to claim 1; and
a pattern formation process in which the energy beam is irradiated on the sensitive object using detection results, and a pattern is formed on the sensitive object.

55. The exposure method according to claim 54 wherein a plurality of detection systems including at least one of the detection system is provided, and a mark of the sensitive object can be detected by the plurality of detection systems.

56. The exposure method according to claim 55 wherein the at least one detection system is moved so that different marks on the sensitive object can be simultaneously detected by at least two of the plurality of detection systems.

57. A device manufacturing method, the method including:
exposing a sensitive object using the exposure method according to claim 54; and
developing the sensitive object which has been exposed.

58. A position detection apparatus which detects positional information of a mark on an object, the apparatus comprising:
a detection system which detects a mark on the object;
a force generation device which can generate an attraction and a repulsion between the detection system and a fixed portion; and
a drive device which drives the detection system at least uniaxially in the horizontal plane, in a state where a predetermined clearance is formed between the detection system and the fixed portion by the attraction and the repulsion generated by the force generation device.

59. The position detection apparatus according to claim 58 wherein
the force generation device can adjust a magnitude of at least one of the attraction and the repulsion.

60. The position detection apparatus according to claim 58 wherein
in the detection system, at least an optical system is supported by suspension by the fixed portion, and by the drive device moving the optical system, a position of a detection area of the detection system becomes variable.

61. An exposure apparatus that forms a pattern on a sensitive object by an irradiation of an energy beam, the apparatus comprising:
the position detection apparatus according to claim 58 which detects positional information of a mark on the sensitive object; and
a patterning device which irradiates the energy beam on the sensitive object using detection results by the position detection apparatus.

62. The exposure apparatus according to claim 61 wherein the position detection apparatus has a plurality of detection systems which has at least one detection system moved by the drive device, and the plurality of detection systems detects positional information of the mark on the sensitive object.

63. The exposure apparatus according to claim 62 wherein the drive device moves the at least one detection system so that different marks on the sensitive object can be simultaneously detected by at least two of the plurality of detection systems.

64. A device manufacturing method, the method including:
exposing a sensitive object using the exposure apparatus according to claim 61; and
developing the sensitive object which has been exposed.

65. A moving method to move a detection system which detects a mark on an object in a horizontal plane, the method comprising:
forming a predetermined clearance between the detection system and a fixed portion by an attraction and a repulsion generated between the detection system and the fixed portion; and
moving the detection system in a horizontal plane, while maintaining the clearance.

66. The moving method according to claim 65, further comprising:
fixing the detection system, which has been moved, to the fixed portion, by adjusting at least one of the attraction and the repulsion and reducing the clearance almost to zero.

67. The moving method according to claim 66 wherein the repulsion is almost zero at a time when the detection system is fixed.

68. The moving method according to claim 65 wherein in the detection system, at least an optical system is supported by suspension by the fixed portion, and by moving the optical system, a position of a detection area of the detection system becomes variable.

69. A position detection method in which positional information of a mark on an object is detected, the method comprising:

moving a detection system using the moving method according to claim 65; and detecting a mark on the object by the detection system which has been moved.

70. An exposure method in which a pattern is formed on a sensitive object by an irradiation of an energy beam, the method comprising:

a detection process in which positional information of a mark on the sensitive object is detected by moving a detection system by the moving method according to claim 65; and a pattern formation process in which the energy beam is irradiated on the sensitive object using detection results, and a pattern is formed on the sensitive object.

71. The exposure method according to claim 70 wherein a plurality of detection systems including at least one of the detection system is provided, and a mark of the sensitive object can be detected by the plurality of detection systems.

72. The exposure method according to claim 71 wherein the at least one detection system is moved so that different marks on the sensitive object can be simultaneously detected by at least two of the plurality of detection systems.

73. A device manufacturing method, the method including:

exposing a sensitive object using the exposure method according to claim 70; and developing the sensitive object which has been exposed.

* * * * *